(12) United States Patent
Yamamoto et al.

(10) Patent No.: US 10,181,748 B2
(45) Date of Patent: Jan. 15, 2019

(54) POWER STORAGE SYSTEM AND POWER STORAGE METHOD

(71) Applicant: FUJIKURA LTD., Tokyo (JP)

(72) Inventors: Kazuhiro Yamamoto, Sakura (JP); Ryoji Yanagimoto, Sakura (JP); Yuji Yamada, Sakura (JP); Kenjiro Yano, Tokyo (JP); Kenichi Okada, Sakura (JP)

(73) Assignee: FUJIKURA LTD., Koto-ku, Tokyo (JP)

( * ) Notice: Subject to any disclaimer, the term of this patent is extended or adjusted under 35 U.S.C. 154(b) by 115 days.

(21) Appl. No.: 15/107,750

(22) PCT Filed: Dec. 26, 2014

(86) PCT No.: PCT/JP2014/084646
§ 371 (c)(1),
(2) Date: Jun. 23, 2016

(87) PCT Pub. No.: WO2015/099159
PCT Pub. Date: Jul. 2, 2015

(65) Prior Publication Data
US 2016/0329737 A1    Nov. 10, 2016

(30) Foreign Application Priority Data

Dec. 27, 2013   (JP) .................................. 2013-272146

(51) Int. Cl.
*H02J 9/00*     (2006.01)
*H02J 7/02*     (2016.01)
(Continued)

(52) U.S. Cl.
CPC ........ *H02J 7/025* (2013.01); *H01L 31/02021* (2013.01); *H01M 14/005* (2013.01);
(Continued)

(58) Field of Classification Search
CPC ...................................................... H02J 9/061
(Continued)

(56) References Cited

U.S. PATENT DOCUMENTS

2007/0063671 A1*   3/2007   Simpson ............... H02J 7/0013
                                                                  320/116
2009/0261352 A1   10/2009   Chen
(Continued)

FOREIGN PATENT DOCUMENTS

CN        101501602 A       8/2009
CN        101561105 A      10/2009
(Continued)

OTHER PUBLICATIONS

Communication dated Jul. 4, 2017, from the Japanese Patent Office in counterpart Japanese application No. 2015-555064.
(Continued)

*Primary Examiner* — Adi Amrany
(74) *Attorney, Agent, or Firm* — Sughrue Mion, PLLC

(57) ABSTRACT

A power storage system includes: a power generation element that performs environmental power generation; a storage battery that is supplied with power generated by the power generation element; a DC/DC converter that converts an output voltage from the power generation element into a predetermined voltage; a first switch unit that switches whether directly supply the output voltage from the power generation element to the storage battery or to supply thereto via the DC/DC converter; and a first changeover unit that compares a voltage of the storage battery with a first threshold voltage, and controls the first switch unit according to a comparison result, in a case where a voltage of the voltage or higher of the storage battery bringing the DC/DC converter into a main boost mode is the first threshold voltage.

7 Claims, 14 Drawing Sheets

(51) Int. Cl.
| | |
|---|---|
| *H02J 50/00* | (2016.01) |
| *H02J 9/06* | (2006.01) |
| *H01L 31/02* | (2006.01) |
| *H02S 40/38* | (2014.01) |
| *H02J 7/35* | (2006.01) |
| *H01M 14/00* | (2006.01) |
| *H01G 9/20* | (2006.01) |

(52) U.S. Cl.
CPC ............... *H02J 7/35* (2013.01); *H02J 9/061* (2013.01); *H02J 50/00* (2016.02); *H02S 40/38* (2014.12); *H01G 9/20* (2013.01); *H01M 2220/10* (2013.01); *Y02E 10/50* (2013.01)

(58) Field of Classification Search
USPC .......................................................... 307/85
See application file for complete search history.

(56) References Cited

U.S. PATENT DOCUMENTS

| | | | |
|---|---|---|---|
| 2009/0289594 A1 | 11/2009 | Sato | |
| 2010/0000804 A1* | 1/2010 | Yeh | B60K 16/00 180/2.2 |
| 2010/0201195 A1* | 8/2010 | Maegawa | H01M 10/425 307/66 |
| 2010/0295381 A1 | 11/2010 | Burger et al. | |
| 2011/0210694 A1* | 9/2011 | Uehashi | H02J 3/32 320/101 |
| 2011/0221383 A1 | 9/2011 | Uehashi et al. | |
| 2012/0176079 A1 | 7/2012 | Nakashima et al. | |
| 2013/0099721 A1* | 4/2013 | Azzam | H02J 7/0063 320/101 |
| 2013/0113281 A1 | 5/2013 | Togashi | |
| 2016/0016483 A1* | 1/2016 | Yasunori | B60L 11/14 320/162 |
| 2016/0049814 A1* | 2/2016 | Sugiyama | H02J 7/0021 320/128 |
| 2016/0322859 A1* | 11/2016 | Yamamoto | H02J 7/0022 |

FOREIGN PATENT DOCUMENTS

| | | |
|---|---|---|
| CN | 201450012 U | 5/2010 |
| CN | 102549878 A | 7/2012 |
| DE | 10057113 A1 | 5/2002 |
| DE | 102008004675 B3 | 3/2009 |
| EP | 2626763 A1 | 8/2013 |
| JP | 62-154122 A | 7/1987 |
| JP | 8251832 A | 9/1996 |
| JP | 2000041336 A * | 2/2000 |
| JP | 2004208479 A | 7/2004 |
| JP | 2004-336974 A | 11/2004 |
| JP | 2007-181278 A | 7/2007 |
| JP | 2011-211885 A | 10/2011 |
| JP | 2012-79322 A | 4/2012 |
| JP | 2012-108829 A | 6/2012 |
| JP | 2013-201099 A | 10/2013 |

OTHER PUBLICATIONS

Communication dated Nov. 7, 2017 from the European Patent Office in counterpart European application No. 14875875.8.
Communication dated Nov. 30, 2016, issued by the State Intellectual Property Office of the P.R.C. in corresponding Chinese Application No. 201480071077.6.
Notice of Allowance of Japanese Patent Application No. 2013-272146, dated Nov. 18, 2014.
Communication dated Jul. 24, 2017, from the State Intellectual Property Office of People's Republic of China in counterpart Application No. 201480071077.6.

* cited by examiner

VL: DRIVING POSSIBLE VOLTAGE OF EXTERNAL LOAD APPARATUS
V1: VOLTAGE CAUSING POWER TO BE SUPPLIED TO STORAGE BATTERY B

FIG. 11
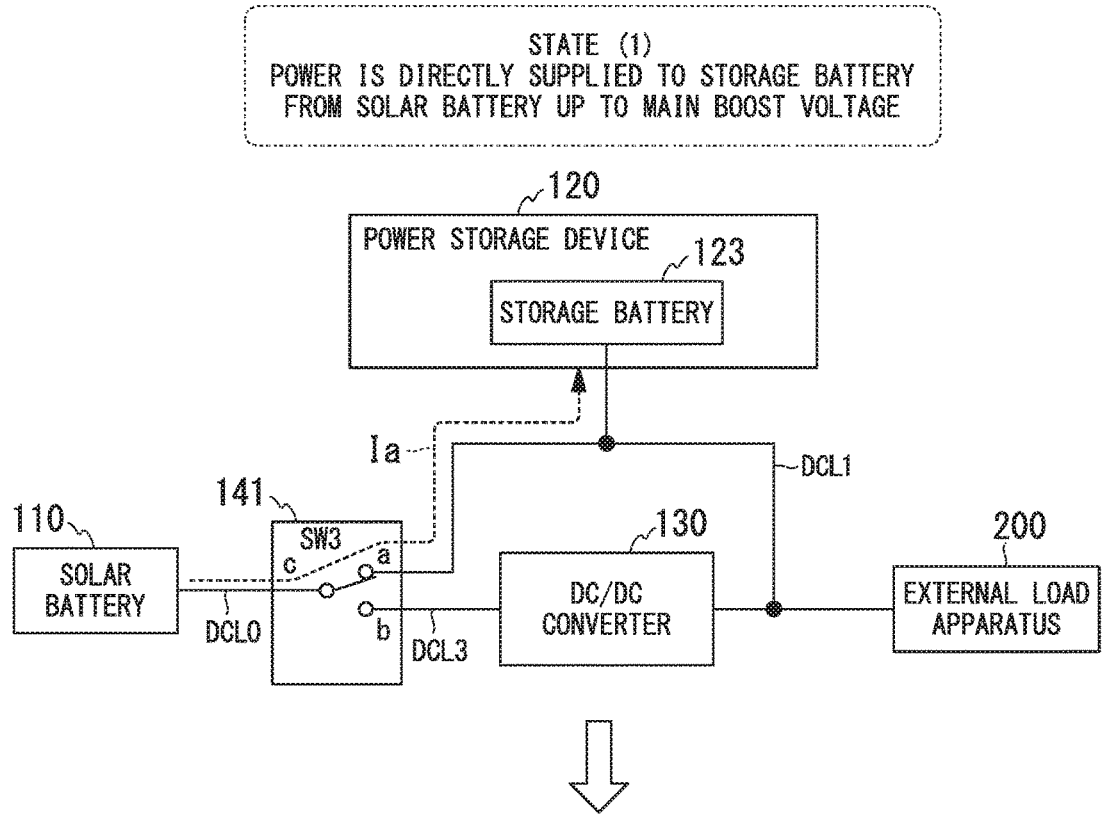
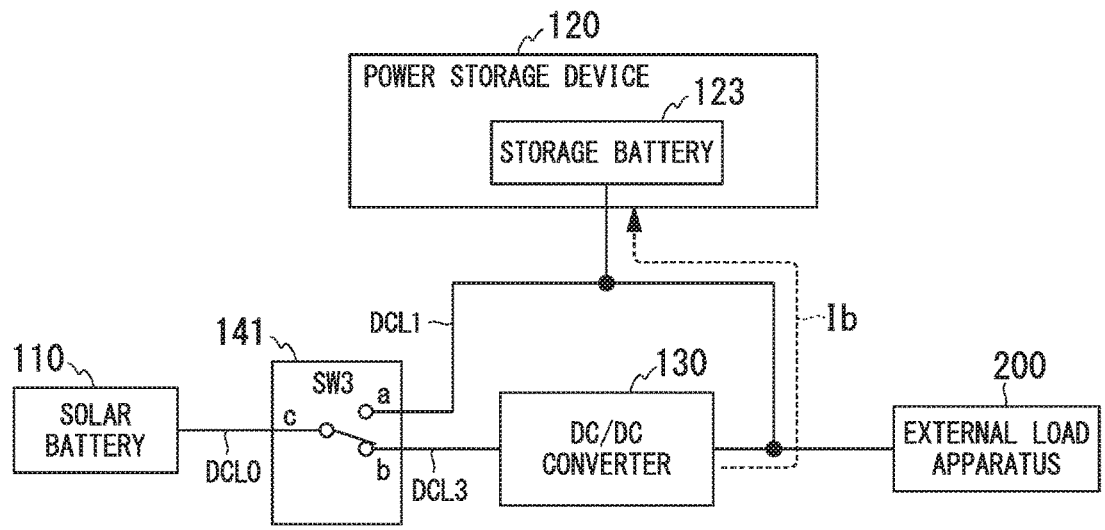

POWER STORAGE SYSTEM AND POWER STORAGE METHOD

CROSS REFERENCE TO RELATED APPLICATIONS

This application is a National Stage of International Application No. PCT/JP2014/084646filed Dec. 26, 2014, claiming priority based on Japanese Patent Application No. 2013-272146, filed Dec. 27, 2013, the contents of all of which are incorporated herein by reference in their entirety.

TECHNICAL FIELD

The present invention relates to a power storage system and a power storage method in which power generated by a power generation element performing environmental power generation is stored in a storage battery, and the power is supplied to an external load apparatus.

BACKGROUND ART

In recent years, energy harvesting (environmental power generation) devices such as a wireless sensor or a remote control switch have attracted attention due to achievement of low power consumption in an electronic circuit or a wireless technique. An energy harvesting device obtains electrical energy from the ambient environment and thus operates without wiring or batteries being replaced. As an energy harvesting device, for example, a low illuminance dye-sensitized solar battery for energy harvesting which is expected to be able to be used in indoor light from a fluorescent lamp or an LED lamp is currently being developed.

Patent Document 1 discloses a power generation system which obtains an appropriate power generation amount required in a solar battery on the basis of the required power, and adjusts a power generation amount of the solar battery according to the obtained power generation amount.

Patent Documents 2 and 3 disclose that, in an outdoor solar battery which generates a high voltage, in a case where a voltage generated by the solar battery is higher than a voltage of a storage battery, the voltage is supplied to the storage battery without using a boost converter, and thus a conversion loss in the boost converter is reduced.

Patent Document 4 discloses that power generated by a dye-sensitized solar battery is stabilized by a regulator circuit or a boosting circuit, and is then supplied to a storage battery.

PRIOR ART DOCUMENTS

Patent Documents

[Patent Document 1] Japanese Unexamined Patent Application, First Publication No. 2012-108829
[Patent Document 2] Japanese Unexamined Patent Application, First Publication No. 2011-211885
[Patent Document 3] Japanese Unexamined Patent Application, First Publication No. S62-154122
[Patent Document 4] Japanese Unexamined Patent Application, First Publication No. 2012-079322

DISCLOSURE OF INVENTION

Problem to be Solved by Invention

Meanwhile, there have been attempts to cause a power generation element generating low power to generate power, store the generated power in a storage battery, and cause a load apparatus to work using the stored power. In this case, there are the following problems.

In other words, in a case where the power generation element is input on an input side, the storage battery cannot be charged to a voltage of a release voltage thereof or higher, and thus a boost converter such as a DC/DC converter is used. However, in a state where a voltage of the storage battery is lower, a conversion loss during voltage boosting in the boost converter increases, and thus there is a problem of the time taken for storing power in the storage battery.

The power storage systems or the power source devices disclosed in the above Patent Documents 1 to 4 are not able to cope with these problems. Particularly, in Patent Documents 2 and 3, an outdoor solar battery generating a high voltage is used, and thus it is not necessary to take into consideration a state in which a voltage of the storage battery is low.

The present invention has been made in consideration of the above-described circumstances, and an object of the present invention is to provide a power storage system and a power storage method capable of reducing the time taken for storing power in a storage battery in a state in which a voltage of the storage battery is low.

Means for Solving the Problems

In order to solve the above problems, according to a first aspect of the present invention, a power storage system includes a power generation element that performs environmental power generation; a storage battery that is supplied with power generated by the power generation element; a DC/DC converter that converts an output voltage from the power generation element into a predetermined voltage; a first switch unit that switches whether to directly supply the output voltage from the power generation element to the storage battery or to supply thereto via the DC/DC converter; and a first changeover unit that compares a voltage of the storage battery with a first threshold voltage, and controls the switch unit according to a comparison result, in a case where a voltage of the voltage or higher of the storage battery bringing the DC/DC converter into a main boost mode is the first threshold voltage. The first changeover unit controls the first switch unit so that the output voltage is directly supplied from the power generation element to the storage battery, in a case where the voltage of the storage battery is equal to or lower than the first threshold voltage. The first changeover unit controls the first switch unit so that the output voltage is supplied from the power generation element to the storage battery via the DC/DC converter, in a case where the voltage of the storage battery exceeds the first threshold voltage.

In the power storage system according to the aspect, the switch unit switching whether the output voltage from the power generation element is directly supplied to the storage battery or is supplied thereto via the DC/DC converter is provided. The changeover unit determines whether or not the voltage of the storage battery exceeds the first threshold voltage which is a predetermined voltage, and controls the switch unit so that the output voltage is directly supplied to the storage battery from the power generation element in a case where the voltage of the storage battery is equal to or lower than the first threshold voltage. In a case where the voltage of the storage battery exceeds the first threshold voltage, the changeover unit controls the switch unit so that the storage battery is charged via the DC/DC converter.

In the power storage system according to the aspect, a voltage of the voltage or higher of the storage battery bringing the DC/DC converter into a main boost mode is the first threshold voltage, and the output voltage is directly supplied to the storage battery from the power generation element in a case where the voltage of the storage battery is equal to or lower than the first threshold voltage. In a case where the voltage of the storage battery increases and thus exceeds the first threshold voltage, the power storage system according to the aspect supplies the output voltage to the storage battery via the DC/DC converter.

Consequently, in the power storage system according to the aspect, even in a case where power generated from a low illuminance dye-sensitized power generation element is low in an environment of a predetermined illuminance or lower, and the voltage of the storage battery is low, it is possible to rapidly increase the voltage of the storage battery without this being influenced by a conversion loss during voltage boosting in the DC/DC converter.

The storage battery may be constituted of a first storage battery and a second storage battery having a capacity larger than a capacity of the first storage battery, and, in a case where a second threshold voltage is higher than the first threshold voltage, the output voltage may be supplied to only the first storage battery from the power generation element if the voltage of the storage battery is equal to or lower than the second threshold voltage.

Consequently, since the power generation element is connected to only the storage battery having a small capacity, it is possible to increase the voltage to the first threshold voltage or higher with low power, and to rapidly cause a main boost mode to occur.

The power storage system according to the aspect may further include a second switch unit that performs switching between an electrical connection state and disconnection state between the first storage battery and the second storage battery; and a second changeover unit that compares the voltage of the first storage battery with a second threshold voltage, and controls the second switch unit according to a comparison result. Each of the first storage battery and the second storage battery may be configured to supply power to an external load apparatus, and the second threshold voltage may be equal to or higher than a voltage causing the external load apparatus to be operated. The second changeover unit may control the second switch unit so that the first storage battery is disconnected from the second storage battery, and thus power generated by the power generation element is supplied to only the first storage battery, in a case where the voltage of the first storage battery is equal to or lower than the second threshold voltage, and the second changeover unit may control the second switch unit so that the first storage battery is connected to the second storage battery, and thus power is supplied from the first storage battery to the second storage battery, in a case where the voltage of the first storage battery exceeds the second threshold voltage.

In the power storage system according to the aspect, it is possible to supply power to the external load apparatus from each storage battery using storage batteries of two types having different capacities. The first changeover unit controls the second switch unit so that power generated by the power generation element is supplied to only the first storage battery until a voltage to which the first storage battery is charged becomes the second threshold voltage. In a case where a voltage of the first storage battery exceeds the second threshold voltage which is a predetermined voltage, the second changeover unit controls the second switch unit so that power is supplied from the first storage battery to the second storage battery.

Consequently, the power storage system can rapidly increase the output voltage supplied to the external load apparatus even in a case where a storage battery having a large capacity is used. Particularly, since the first storage battery is connected to the external load apparatus, it is possible to increase the output voltage supplied to the external load apparatus even before the second storage battery having a large capacity is charged.

The power storage system according to the aspect may further include a third switch unit that performs switching between an electrical connection state and disconnection state between the first storage battery and the second storage battery, and the external load apparatus; and a third changeover unit that compares the voltage of the first storage battery with a third threshold voltage, and controls the third switch unit according to a comparison result. The third changeover unit may control the third switch unit so that the first storage battery and the second storage battery are connected to the external load apparatus, in a case where the voltage of the first storage battery is higher than the third threshold voltage, and the third changeover unit may control the third switch unit so that the first storage battery and the second storage battery are disconnected from the external load apparatus, in a case where the voltage of the first storage battery is lower than the third threshold voltage.

In the power storage system according to the aspect, the third switch unit that performs switching between an electrical connection state and disconnection state between the first storage battery and the second storage battery, and the external load apparatus is provided. In a case where the voltage of the first storage battery is higher than the third threshold voltage, the third changeover unit brings the third switch unit into a connection state so that power is supplied from the power storage system to the external load apparatus. In a case where the voltage of the first storage battery is lower than the third threshold voltage, the third changeover unit brings the third switch unit into a disconnection state so that the power storage system is disconnected from the external load apparatus.

Consequently, in the power storage system, in a case where a voltage of the first storage battery is low, such as a case where the power storage device is initially charged, wasteful power consumption is prevented by stopping the supply of power to the external load apparatus, and thus it is possible to quicken charging of the first storage battery.

The third threshold voltage may be set to be a predetermined voltage higher than an operation voltage causing the external load apparatus to be operated, and to be lower than the second threshold voltage.

Consequently, in the power storage system, it is possible to reliably operate the external load apparatus in a case where power is supplied to the external load apparatus.

The second changeover unit may have hysteresis characteristics, and compare the voltage of the first storage battery with the second threshold voltage using the hysteresis characteristics. In a case where the voltage of the first storage battery exceeds the second threshold voltage, the second changeover unit may control the second switch unit so that the first storage battery is connected to the second storage battery, and, in a state where the first storage battery is connected to the second storage battery, and the voltage of the first storage battery is reduced to a fourth threshold voltage or lower, the fourth threshold voltage being a predetermined voltage lower than the second threshold voltage and being a predetermined voltage higher than the first threshold voltage, the second changeover unit may control the second switch unit so that the first storage battery is disconnected from the second storage battery.

In the power storage system according to the aspect, in a case where it is detected that the voltage of the first storage battery exceeds the second threshold voltage, the second changeover unit connects the first storage battery to the second storage battery. Thereafter, power is supplied from the first storage battery to the second storage battery, and thus the voltage of the first storage battery is reduced. In a case where it is detected that the voltage of the first storage battery is reduced to the fourth threshold voltage or lower, the fourth threshold voltage being a predetermined voltage lower than the second threshold voltage and being a predetermined voltage higher than the first threshold voltage, the second changeover unit disconnects the first storage battery from the second storage battery. In other words, the second changeover unit controls opening and closing of the second switch unit using the hysteresis characteristics.

Consequently, in the power storage system, it is possible to supply power from the first storage battery to the second storage battery, and also to prevent the voltage of the first storage battery from being reduced to the first threshold voltage or lower and thus to prevent the DC/DC converter from being brought into a cold start mode.

The power generation element may be constituted of power generation element cells which are connected in series to each other.

Consequently, in the power storage system according to the aspect, the power generation element can output a necessary voltage.

The power generation element may be a low illuminance solar battery which can be used in an environment of a predetermined illuminance or lower.

Consequently, in the power storage system, it is possible to rapidly increase an output voltage which is output to the outside even in a case where power output from the low illuminance solar battery is stored in a storage battery having a large capacity.

According to a second aspect of the present invention, a power storage method includes providing a power storage system including a storage battery that is supplied with power generated by a power generation element performing environmental power generation, a DC/DC converter that converts an output voltage from the power generation element into a predetermined voltage, a switch unit that switches whether to directly supply the output voltage from the power generation element to the storage battery or to supply thereto via the DC/DC converter, and a changeover unit that compares a voltage of the storage battery with a first threshold voltage, and controls the switch unit according to a comparison result, in a case where a voltage of the voltage or higher of the storage battery bringing the DC/DC converter into a main boost mode is the first threshold voltage; causing the changeover unit to control the switch unit so that the output voltage is directly supplied from the power generation element to the storage battery, in a case where the voltage of the storage battery is equal to or lower than the first threshold voltage; and causing the changeover unit to control the switch unit so that the output voltage is supplied from the power generation element to the storage battery via the DC/DC converter, in a case where the voltage of the storage battery exceeds the first threshold voltage.

Consequently, in the power storage system according to the aspect, it is possible to shorten time for storing power in the storage battery even in a state in which the voltage of the storage battery is low due to low generated power output from a low illuminance dye-sensitized power generation element in an environment of a predetermined illuminance or lower.

Effects of the Invention

According to the power storage system according to the aspects of the present invention, it is possible to shorten time for storing power in a storage battery in a state in which a voltage of the storage battery is low.

BRIEF DESCRIPTION OF DRAWINGS

FIG. 11 is an explanatory diagram showing an aspect of a charging operation of a storage battery 123.

EMBODIMENTS FOR CARRYING OUT THE INVENTION

An embodiment of the present invention will be described with reference to the accompanying drawings.

[Example of Environment Monitoring System Using Power Storage System]

Figure 1:
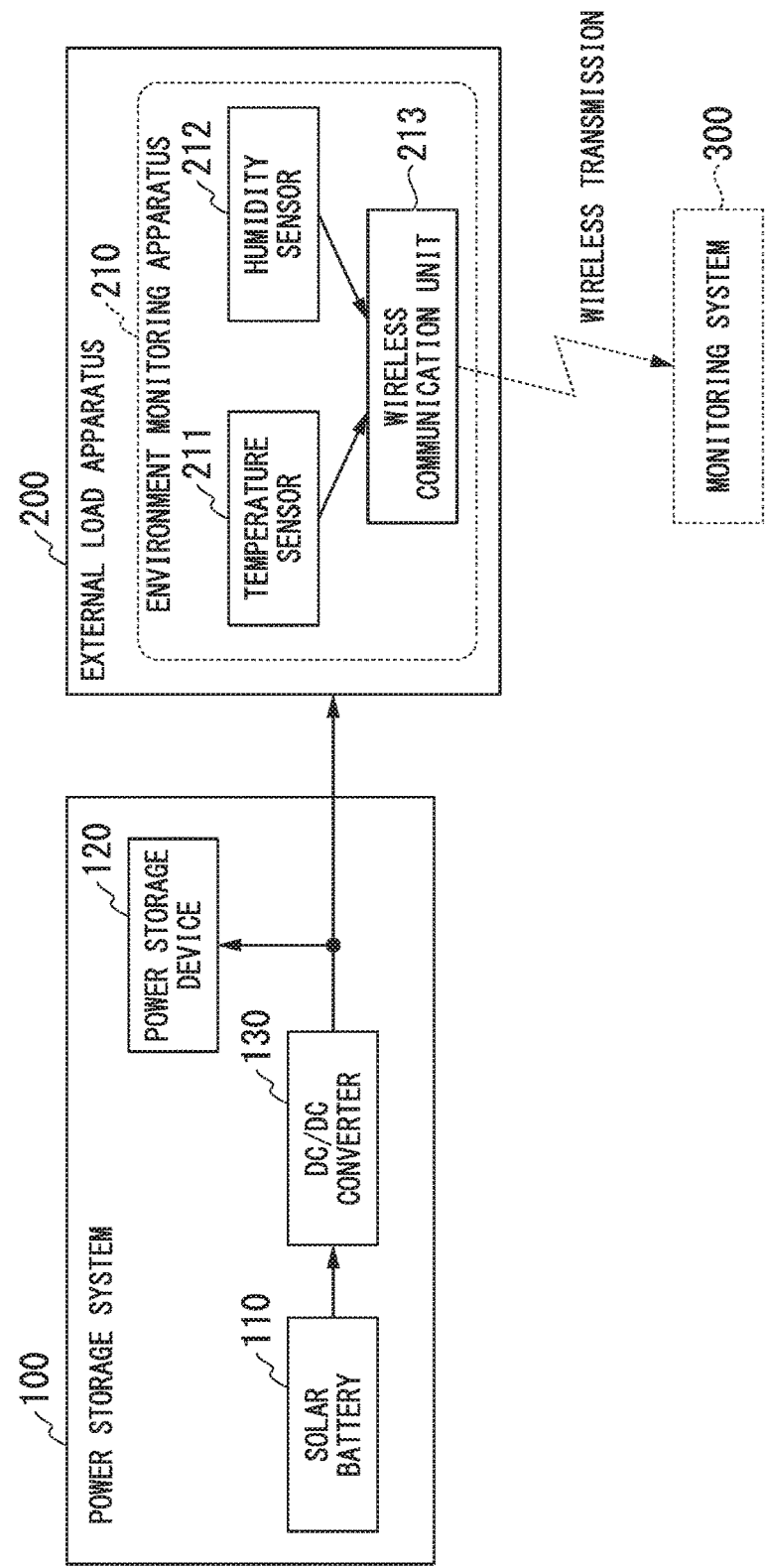
FIG. 1 is a configuration diagram showing a schematic configuration of an environment monitoring system in which a power storage system according to an embodiment of the present invention is used.

FIG. 1 is a configuration diagram showing a schematic configuration of an environment monitoring system in which a power storage system according to an embodiment of the present invention is used. As shown in FIG. 1, an environment monitoring system 1 includes a power storage system 100 which power generated by a power generation element performing environmental power generation is stored in a storage battery, and an external load apparatus 200 to which power is supplied from the power storage system 100. The external load apparatus 200 may be, for example, an environment monitoring apparatus 210 which functions as a wireless sensor operated without wiring or batteries being replaced.

The environment monitoring apparatus 210 is provided with a temperature sensor 211 which measures the temperature in a room such as an office, and a humidity sensor 212 which measures the humidity in the room. The environment monitoring apparatus 210 periodically wirelessly transmits information regarding the indoor temperature measured by the temperature sensor 211 and information regarding the indoor humidity measured by the humidity sensor 212, to an external monitoring system 300 via a wireless communication unit 213.

The power storage system 100 which supplies power to the external load apparatus 200 includes a solar battery 110 which is a power generation element, a power storage device 120, and a DC/DC converter 130. The solar battery 110 is a low illuminance solar battery, and is used at the illuminance of 10000 Lux or less, for example. In the power storage system 100, power generated by the solar battery 110 is supplied to the power storage device 120 via the DC/DC converter 130, and the power is stored in the power storage device 120. The power storage system 100 supplies the power stored in the power storage device 120 to the external load apparatus 200. Details of a configuration and an operation of the power storage system 100 will be described later.

Figure 2A:
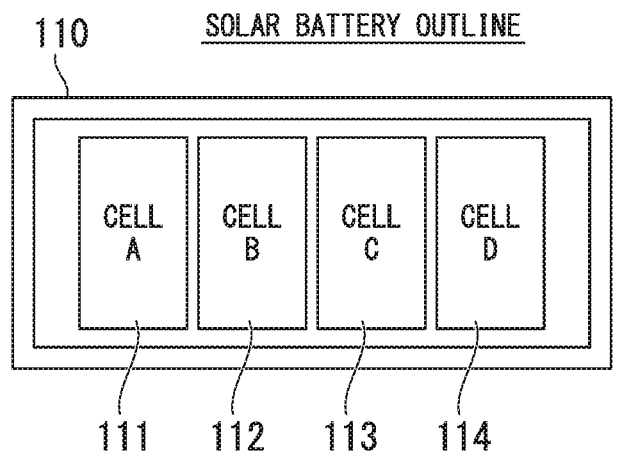
FIG. 2A is an explanatory diagram showing an outline of a solar battery and a state in which solar battery cells are connected to each other.
Figure 2B:
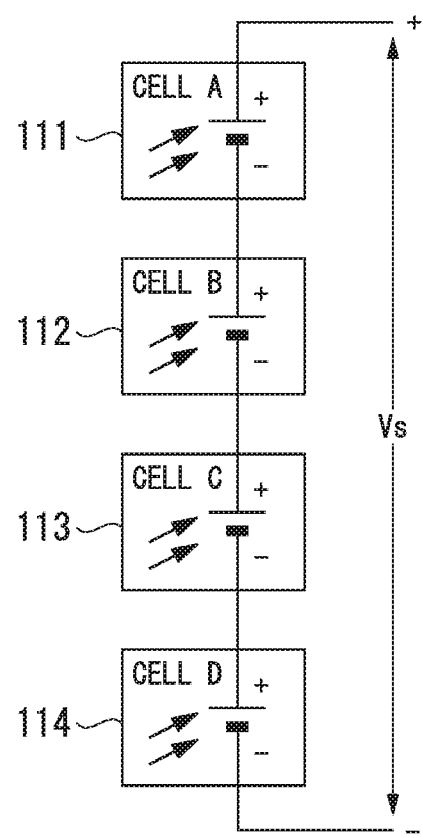
FIG. 2B is an explanatory diagram showing an outline of a solar battery and a state in which solar battery cells are connected to each other.

FIGS. 2A and 2B are explanatory diagrams showing an outline of the storage battery (power generation element) and a state in which storage battery cells (power generation element cells) are connected to each other. As shown in a plan view of FIG. 2A, four solar battery cells A111, B112, C113 and D114 are arranged in a planar shape on a light reception surface of the solar battery 110. The four solar battery cells A111, B112, C113 and D114 are configured to be connected in series to each other so as to obtain a predetermined output voltage Vs, as shown in FIG. 2B.

In the solar battery 110 shown in FIGS. 2A and 2B, an example is shown in which the four solar battery cells are connected in series to each other, but the number of solar battery cells connected in series to each other is not limited. The number of solar battery cells is selected so that a voltage output to the DC/DC converter 130 becomes a voltage causing a boost operation of predetermined efficiency or more in the DC/DC converter 130. For example, in a case where the solar battery cell is a low illuminance dye-sensitized solar battery, the number of solar battery cells connected in series to each other is preferably at least three.

Meanwhile, in a case where the solar battery 110 is used as an input power source, if the external load apparatus 200 is to be continuously driven, it is necessary to store an amount of power to be consumed at night at which illumination does not reach the solar battery, in a storage battery. Further, in a case where the use of the solar battery in a room such as an office is taken into consideration, it is necessary to store an amount of power to be consumed on Saturdays, Sundays, and national holidays. In order to increase power stored in the storage battery, a method of increasing the capacity of the storage battery or charging the storage battery to a high voltage may be used. However, since it takes time to charge the storage battery in either method, time is lengthened until the external load apparatus 200 can be driven.

In the power storage system according to the present embodiment, in order to solve the above problem, two types of storage battery A121 and storage battery B122 having different capacities, and a switch unit 140 as a switching mechanism are used.

Figure 3:
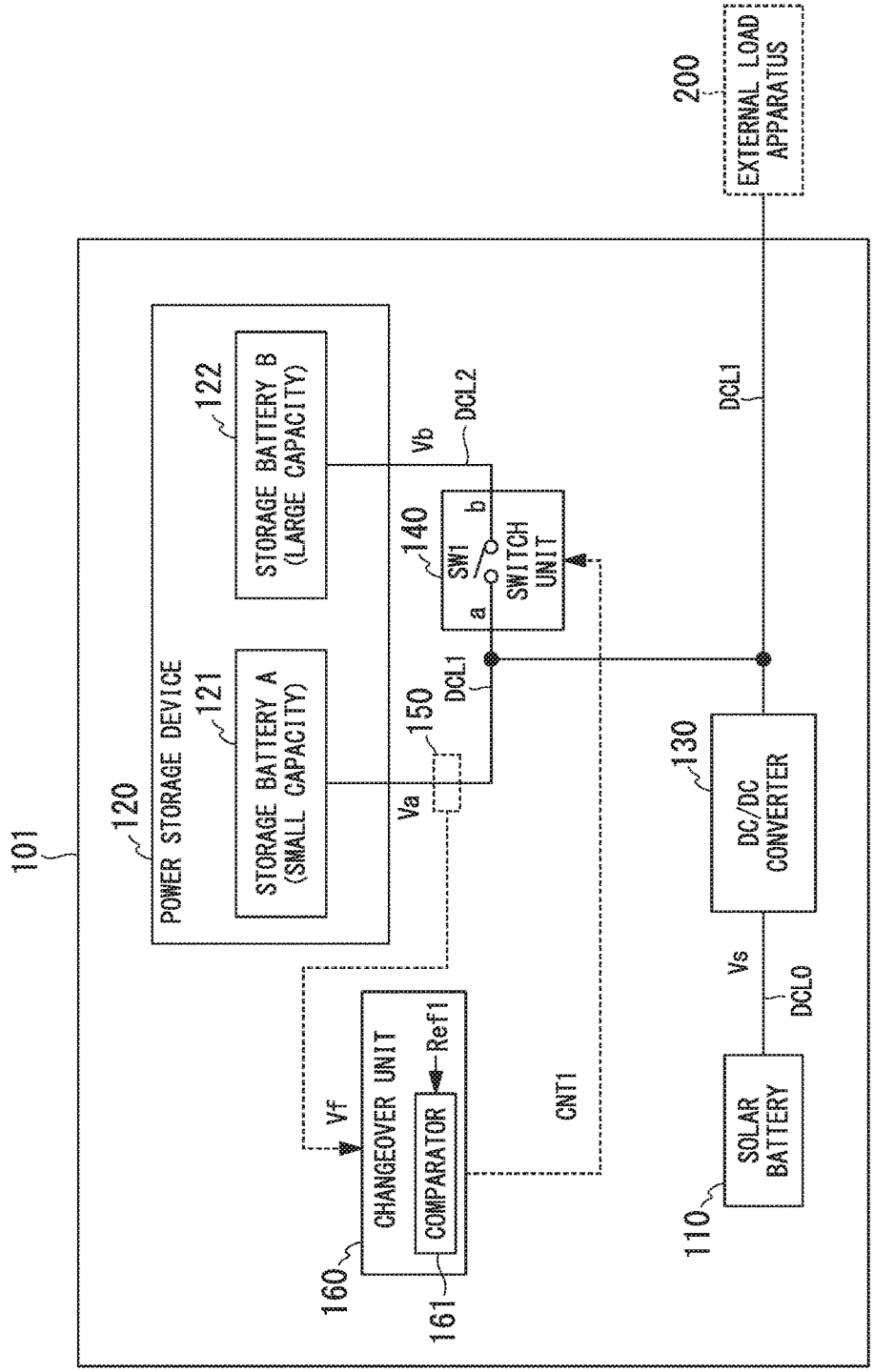
FIG. 3 is a configuration diagram showing a configuration example of a power storage system 101.

FIG. 3 is a configuration diagram showing a configuration of a power storage system 101. The power storage system 101 shown in FIG. 3 includes the solar battery 110 (power generation element), the power storage device 120, the DC/DC converter 130, the switch unit 140 (second switch unit), a voltage detection unit 150, and a changeover unit 160 (second changeover unit).

The solar battery 110 is a low illuminance solar battery shown in FIGS. 2A and 2B. The power storage device 120 is constituted of a secondary battery, a capacitor, or the like corresponding to use for energy harvesting, and includes the storage battery A121 having a small capacity and the storage battery B122 having a large capacity.

The magnitude of the capacity of the storage battery A121 (first storage battery) is set on the basis of a time period until a voltage causing the external load apparatus 200 to be driven is increased from the supply of power from the solar battery 110, the extent to which a voltage of the storage battery A121 drops when power is supplied from the storage battery A121 to the storage battery B122, and a time period in which the external load apparatus 200 can be continuously driven with power from the storage battery A121. The magnitude of the capacity of the storage battery B122 (second storage battery) is set on the basis of a load capacity of the external load apparatus 200, and a time period in which the external load apparatus 200 can be continuously driven. For example, the capacity ratio of the storage battery B122 to the storage battery A121 is set to be about several times to several tens of times.

Figure 4:
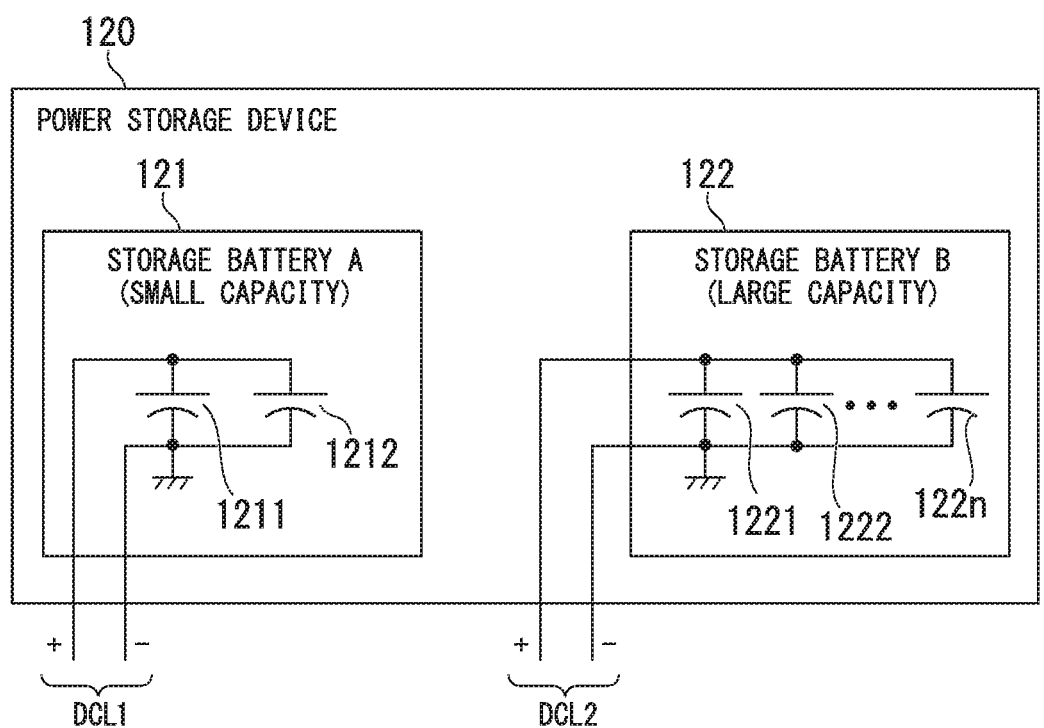
FIG. 4 is a configuration diagram showing an example in which each of a storage battery A121 and a storage battery B122 is constituted of a plurality of storage batteries.

Each of the storage battery A121 and the storage battery B122 may be constituted of a single battery, or may be constituted of a plurality of batteries as shown in FIG. 4. In the example shown in FIG. 4, for example, the storage battery A121 is constituted of two storage batteries including a storage battery 1211 and a storage battery 1212, and the storage battery B122 is constituted of n storage batteries including a storage battery 1221, a storage battery 1222, . . . , and a storage battery 122n. In other words, each of the storage battery A121 and the storage battery B122 may be constituted of any number of storage batteries.

As shown in FIG. 3, an output side of the solar battery 110 is connected to an input side of the DC/DC converter (a boost converter) 130 via a power supply line DCL0. The DC/DC converter 130 is constituted of a DC/DC converter device or the like, receives the output voltage Vs from the solar battery 110, and steps up the voltage Vs to a predetermined voltage which is then output to a power supply line DCL1. In the present embodiment, the DC/DC converter 130 is provided to step up a voltage, but a voltage may be stepped down using the DC/DC converter 130 as necessary.

An output side of the DC/DC converter 130 is connected to the storage battery A121 via the power supply line DCL1, and is also connected to one terminal a of the switch unit 140. The other terminal b of the switch unit 140 is connected to the storage battery B122 via a power supply line DCL2.

The switch unit 140 turns on (closed state) or off (open state) an internal switch SW1 according to instruction content of a control signal CNT1 input from the changeover unit 160, and thus performs switching between an electrical connection state and disconnection state between the power supply line DCL1 and the power supply line DCL2. In other words, if the switch SW1 is turned on, the storage battery A121 and the storage battery B122 are electrically connected in parallel to each other via the switch SW1. If the switch SW1 is turned off, the storage battery A121 and the storage battery B122 are electrically disconnected from each other.

FIG. 3 shows an example in which the switch unit 140 is constituted of the switch SW1 using a mechanical contact point. However, actually, the switch SW1 includes a semiconductor switch including a semiconductor switching element such as a metal oxide semiconductor field effect transistor (MOSFET) or an insulated gate bipolar transistor (IGBT).

In FIG. 3, each of the power supply line DCL0, the power supply line DCL1, and the power supply line DCL2 is shown as a single line, but, actually, includes a positive side power supply line and a negative side power supply line (a ground line). The switch SW1 of the switch unit 140 may be a one-circuit switch performing switching a connection state and a disconnection state of, for example, only the positive side power supply line, of the positive side power supply line and the negative side power supply line, or may be a two-circuit switch performing switching a connection state and a disconnection state of both of the positive side power supply line and the negative side power supply line. This is also the same for FIGS. 9, 10 and 13 which will be described later.

The voltage detection unit 150 is constituted of, for example, a resistance voltage-dividing circuit, and detects a voltage of the power supply line DCL1. The voltage of the power supply line DCL1 is the same as a voltage Va of the storage battery A121. Thus, the voltage detection unit 150 detects the voltage of the power supply line DCL1, and thus detects the voltage Va which is a charging voltage of the storage battery A121. The voltage detection unit 150 outputs a detection signal Vf for the voltage Va of the storage battery A121 to the changeover unit 160.

The changeover unit 160 includes a comparator 161. The comparator 161 compares a predetermined reference voltage Ref1 generated by a reference voltage generation circuit (not shown) with the detection signal Vf for the voltage Va of the storage battery A121 which is input from the voltage detection unit 150. The reference voltage Ref1 corresponds to a voltage V1 (second threshold voltage) of the storage battery A121, and is used to determine whether or not the voltage Va of the storage battery A121 exceeds the voltage V1 causing power to be supplied to the storage battery B122.

The changeover unit 160 outputs the control signal CNT1 for turning on and off (closing and opening) the switch SW1 of the switch unit 140 to the switch unit 140 in response to a comparison result in the comparator 161. The switch unit 140 performs an opening or closing operation of the switch SW1 on the basis of the control signal CNT1.

In other words, in a case where the voltage Va of the storage battery A121 is lower than the voltage V1, the changeover unit 160 turns off the switch SW1 of the switch unit 140 using the control signal CNT1, and thus the storage battery A121 is electrically disconnected from the storage battery B122. Consequently, power generated by the solar battery 110 is supplied to only the storage battery A121 via the DC/DC converter 130.

In a case where the voltage Va of the storage battery A121 exceeds the voltage V1, The changeover unit 160 turns on the switch SW1, and thus the storage battery A121 is connected in parallel to the storage battery B122. As a result, power is supplied to the storage battery B122 by electric charge accumulated in the storage battery A121, or by both of power output from the DC/DC converter 130 and electric charge accumulated in storage battery A121.

When power is supplied to the storage battery B122, power output from the DC/DC converter 130 is low, and thus the power is mainly supplied from the storage battery A121 to the storage battery B122. Therefore, the following description will be made assuming that the supply of power to the storage battery B122 is performed from the storage battery A121.

The comparator 161 of the changeover unit 160 performs determination using hysteresis characteristics when comparing the magnitudes of the detection signal Vf for the voltage Va of the storage battery A121 and the reference voltage Ref1 with each other. In other words, after detecting that the voltage Va of the storage battery A121 exceeds the voltage V1 the comparator 161 determines that the voltage Va of the storage battery A121 is equal to or lower than the voltage V1 when the voltage Va is reduced to a voltage V1' (=V1−ΔV) which is lower than the voltage V1 by a predetermined voltage ΔV.

Therefore, the changeover unit 160 detects that the voltage Va of the storage battery A121 exceeds the voltage V1, temporarily outputs the control signal CNT1 for turning on the switch SW1, and then continuously outputs the control signal CNT1 for turning on SW1 until the voltage Va is reduced to the voltage V1' (fourth threshold voltage).

The voltage V1' is set to be lower than the voltage V1 by a predetermined voltage, and to be higher than a driving possible voltage VL of the external load apparatus 200 by a predetermined voltage (V1'>VL). In other words, the voltage V1 is also set to be higher than the driving possible voltage VL of the external load apparatus 200 (V1>V1'>VL). Consequently, it is possible to prevent the DC/DC converter from being brought into a cold start mode.

Figure 5:
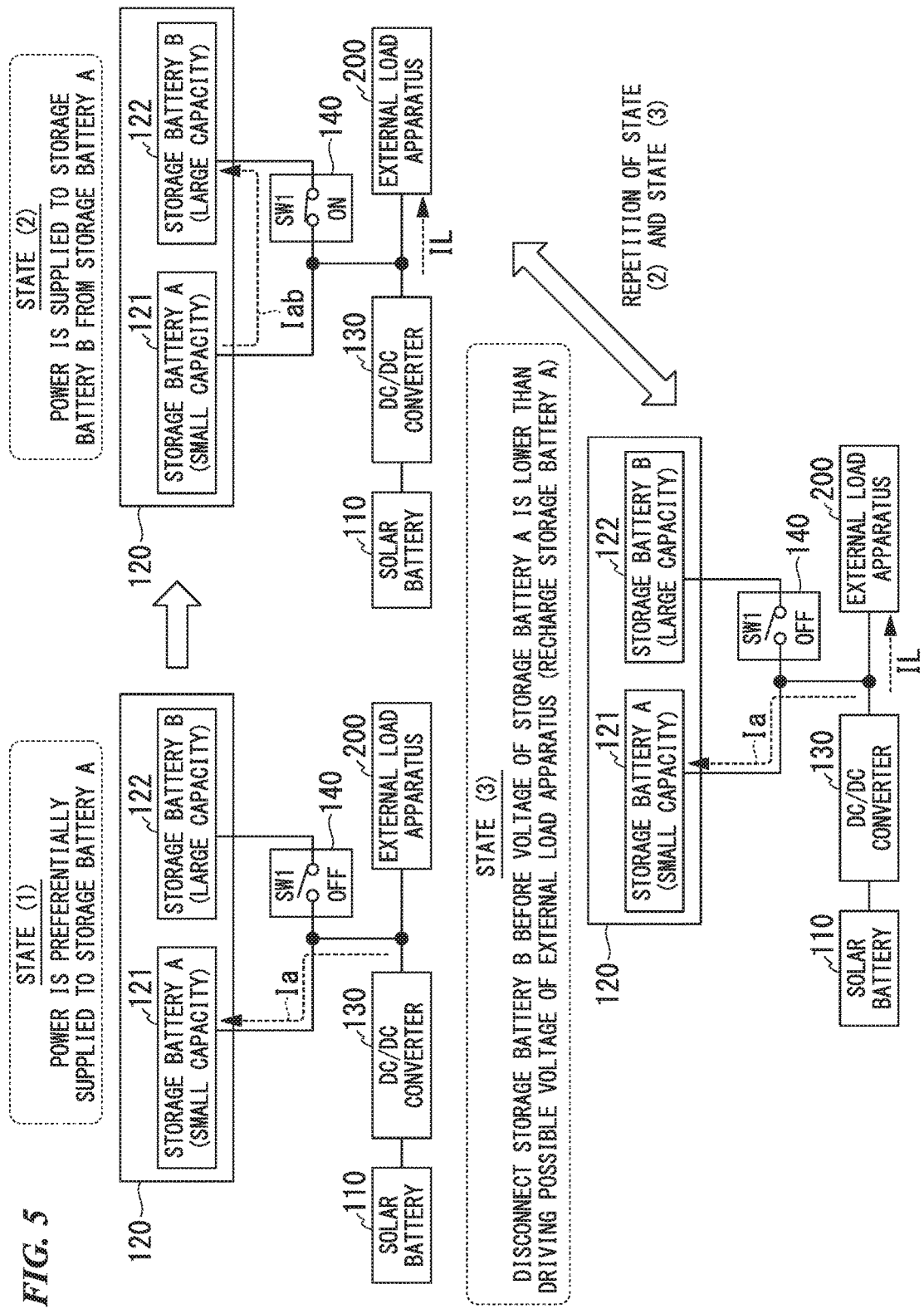
FIG. 5 is an explanatory diagram showing an aspect of a charging operation of the storage battery A121 and the storage battery B122.

FIG. 5 is an explanatory diagram showing an embodiment of a charging operation of the storage battery A121 and the storage battery B122.

Hereinafter, with reference to FIG. 5, a description will be made of an embodiment of a charging operation of the storage battery A121 and the storage battery B122.

In a case where power is initially supplied to the power storage device 120, that is, both of the storage battery A121 and the storage battery B122 are not charged, first, as shown in a state (1), the switch SW1 of the switch unit 140 is turned off Consequently, a charging current Ia flows through only the storage battery A121 from the DC/DC converter 130, and thus the storage battery A121 is preferentially charged.

In a case where the charging of the storage battery A121 progresses, and thus a voltage of the storage battery A121 increases to the voltage V1 causing power to be supplied to the storage battery B122, the switch SW1 of the switch unit 140 is turned on as shown in a state (2). Consequently, a charging current Iab flows from the storage battery A121 to the storage battery B122 due to electric charge accumulated in the storage battery A121, and thus power is supplied to the storage battery B122.

Thereafter, if the current Iab flows from the storage battery A121 to the storage battery B122, the voltage Va of the storage battery A121 is likely to be reduced to a balanced voltage between the storage battery A121 and the storage battery B122. Thus, the changeover unit 160 turns off the switch SW1 of the switch unit 140 as shown in a state (3) before the voltage Va of the storage battery A121 becomes lower than the driving possible voltage VL of the external load apparatus 200, that is, the voltage of the storage battery A121 is reduced to the voltage V1' (V1>V1'>VL), and thus the storage battery B122 is electrically disconnected from the storage battery A121. Detection of the voltage of the storage battery A121 being reduced to the voltage V1' is performed using the above-described hysteresis characteristic of the comparator 161. Thus, the voltage Va of the storage battery A121 changes between the voltage V1 and the voltage V1'.

Thereafter, the state (2) and the state (3) are repeated, and, thus, in the power storage system 101, a current IL is made to flow through the external load apparatus 200 so that the external load apparatus 200 is driven, and power can also be stored in the storage battery B122. As mentioned above, in the power storage system 101, power storage in the storage battery B122 progresses by repeating the state (2) and the state (3). Consequently, the storage battery B122 can be charged so that the external load apparatus 200 can be continuously driven even at night or on holidays.

Figure 6:
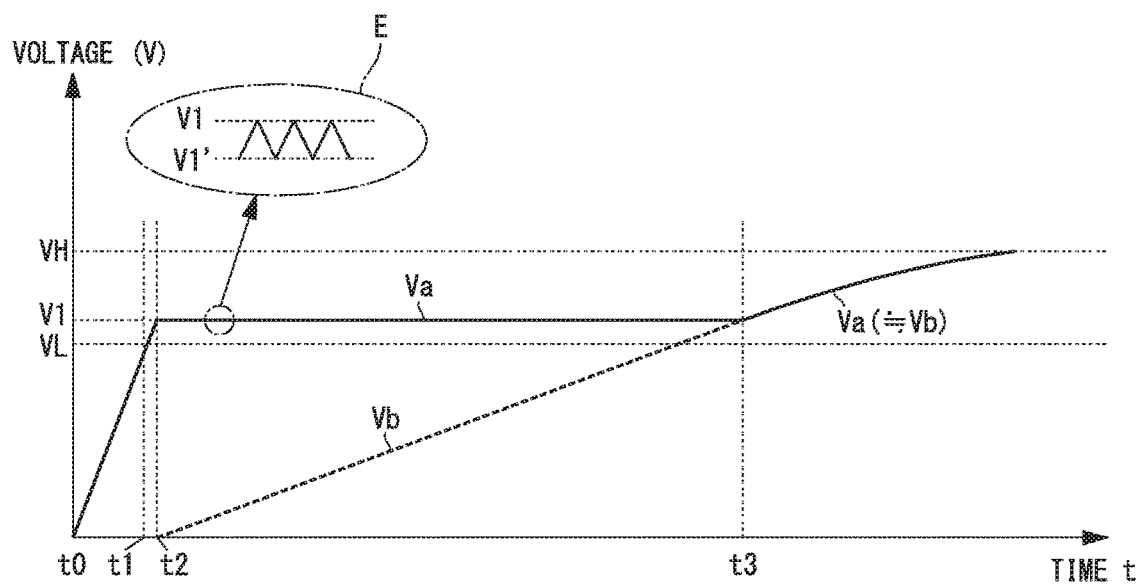
FIG. 6 is an explanatory diagram showing an image of changes in voltages of the storage battery A121 and the storage battery B122.

FIG. 6 is an explanatory diagram showing an image of changes in voltages of the storage battery A121 and the storage battery B122. In FIG. 6, a transverse axis expresses elapse of time t, and a longitudinal axis expresses a voltage. FIG. 6 shows an embodiment of a temporal change in the voltage Va of the storage battery A121 and an embodiment of a temporal change in the voltage Vb of the storage battery B122.

At a time point t0 in FIG. 6, charging of the power storage device 120 is started from the solar battery 110 via the DC/DC converter 130. When the charging is started at the time point t0, as shown in the state (1) in FIG. 5, the changeover unit 160 turns off the switch SW1 of the switch unit 140 so that the supply of power to only the storage battery A121 is started.

Successively, if the voltage Va of the storage battery A121 gradually increases between the time point t0 and a time point t1, and reaches the driving possible voltage VL of the external load apparatus 200 at the time point t1, the external load apparatus 200 is activated.

The external load apparatus 200 is, for example, the above-described environment monitoring apparatus 210, and the environment monitoring apparatus 210 periodically transmits temperature information, humidity information, or the like, to outside in a wireless manner.

If the voltage Va of the storage battery A121 increases to the voltage V1 from the time point t1 to a time point t2 after the external load apparatus 200 is activated, the changeover unit 160 turns on the switch SW1 of the switch unit 140 so that power is supplied to the storage battery B122 due to electric charge accumulated in the storage battery A121.

In a case where power is supplied from the storage battery A121 to the storage battery B122, the voltage Va of the storage battery A121 is likely to be reduced to a balanced voltage between the storage battery A121 and the storage battery B122. Thus, the changeover unit 160 turns off the switch SW1 before the voltage Va of the storage battery A121 becomes lower than the driving possible voltage VL of the external load apparatus 200, that is, the voltage of the storage battery A121 is reduced to the voltage V1' (V1>V1'>VL), and thus the storage battery B122 is electrically disconnected from the storage battery A121. In a case where the voltage Va of the storage battery A121 exceeds the voltage V1 again after the switch SW1 is turned off, the changeover unit 160 turns on the switch SW1 again, and thus power is supplied from the storage battery A121 to the storage battery B122. In other words, the changeover unit 190 causes power to be supplied from the storage battery A121 to the storage battery B122 while repeatedly performing the turning-on and turning-off operations of the switch SW1.

Therefore, the voltage Va of the storage battery A121 becomes a voltage which changes between the voltage V1 and the voltage V1' as enlarged and indicated in a portion E surrounded by a dashed line in FIG. 6.

The storage battery B122 is charged after the time point t2, and thus the voltage Vb of the storage battery B122 gradually increases.

At a time point t3 after the time point t2, the charging is performed until the voltage Vb of the storage battery B122 is nearly the same as the voltage of the storage battery A121. After the time point t3, power can be supplied to the external load apparatus 200 from the storage battery A121 and the storage battery B122.

If the voltages of the storage battery A121 and the storage battery B122 become a voltage VH, the DC/DC converter 130 stops outputting so as to prevent the storage battery A121 and the storage battery B122 from being overcharged, and the supply of power to the storage battery A121 and the storage battery B122 is also stopped.

Figure 7:
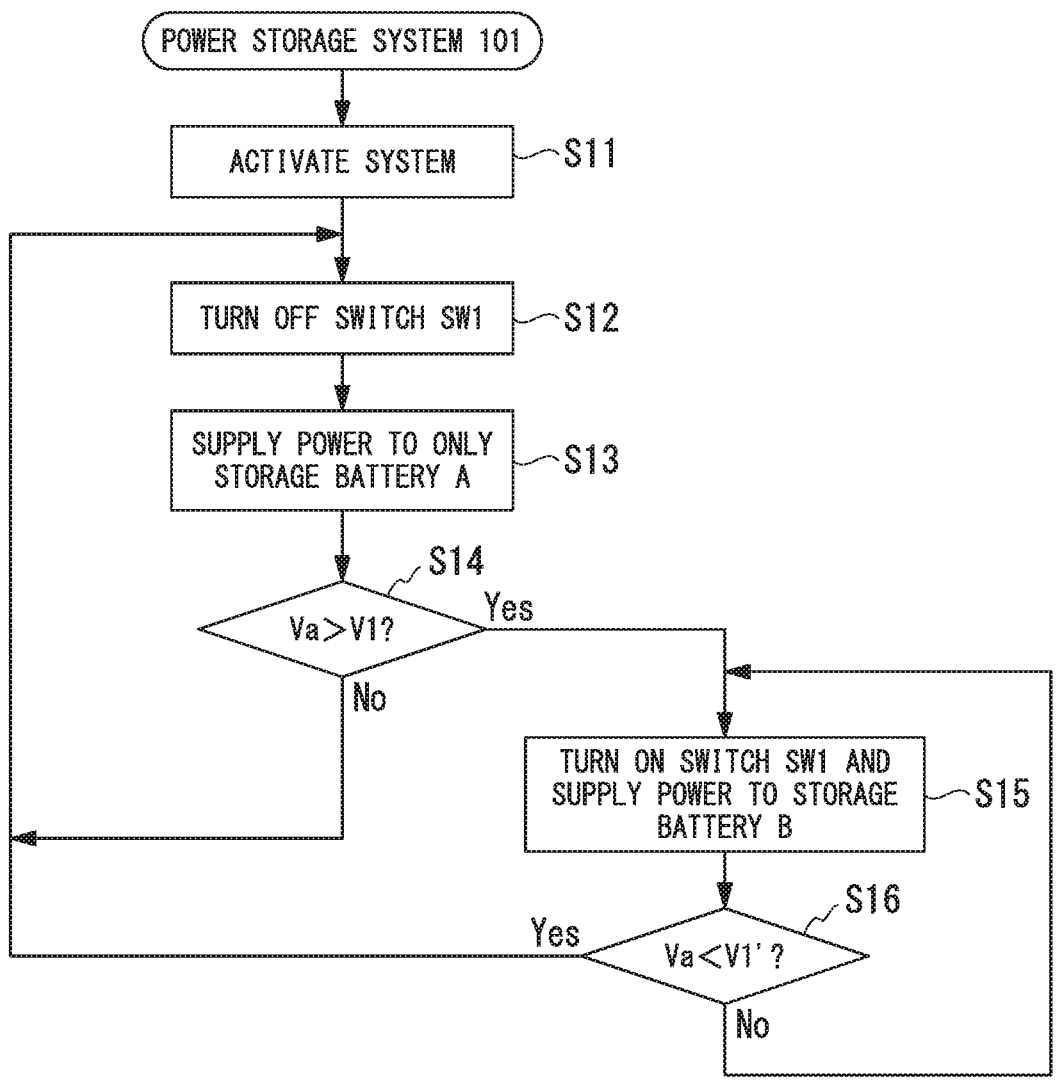
FIG. 7 is a flowchart showing a flow of processes in the power storage system 101.

FIG. 7 is a flowchart showing a flow of processes in the power storage system 101, and is a flowchart showing a flow of the above-described operations in the power storage system 101.

Hereinafter, with reference to FIG. 7, the flow of the processes will be described.

First, it is assumed that the storage battery A121 and the storage battery B122 are not charged. If the power storage system 101 is activated (step S11), the changeover unit 160 turns off the switch SW1 of the switch unit 140 (step S12). The solar battery 110 starts the supply of power to only the storage battery A121 via the DC/DC converter 130 (step S13).

Successively, power is supplied to the storage battery A121, and thus the voltage Va of the storage battery A121 increases. The comparator 161 of the changeover unit 160 determines whether or not the voltage Va of the storage battery A121 exceeds the voltage V1 causing power to be supplied to the storage battery B122 (step S14).

In a case where it is determined that the voltage Va of the storage battery A121 exceeds the voltage V1 in step S14 (step S14: Yes), the flow proceeds to a process in step S15. In step S15, the changeover unit 160 turns on the switch SW1 of the switch unit 140, so that the supply of power from the storage battery A121 to the storage battery B122 is started. Power is supplied from the storage battery A121 to the storage battery B122, and thus the voltage Va of the storage battery A121 decreases.

Next, the comparator 161 of the changeover unit 160 determines whether or not the voltage Va of the storage battery A121 is lower than the voltage V1' (=V1−ΔV) (step S16).

In a case where it is determined that the voltage Va of the storage battery A121 is not lower than the voltage V1' in step S16 (step S16: No), the changeover unit 160 returns to the process in step S15, and continues to supply power to the storage battery B122 from the storage battery A121.

On the other hand, in a case where it is determined that the voltage Va of the storage battery A121 is lower than the voltage V1 in step S16 (step S16: Yes), the changeover unit 190 returns to the process in step S12, and turns off the switch SW1 of the switch unit 140 so that the supply of power to only the storage battery A121 is started again.

The power storage system 101 can rapidly increase the voltage output to the external load apparatus 200 due to the flow of the processes even in a case where a storage battery having a large capacity is used. It is possible to store power in the storage battery B122 while driving the external load apparatus 200 in the power storage system 101.

Figure 8:
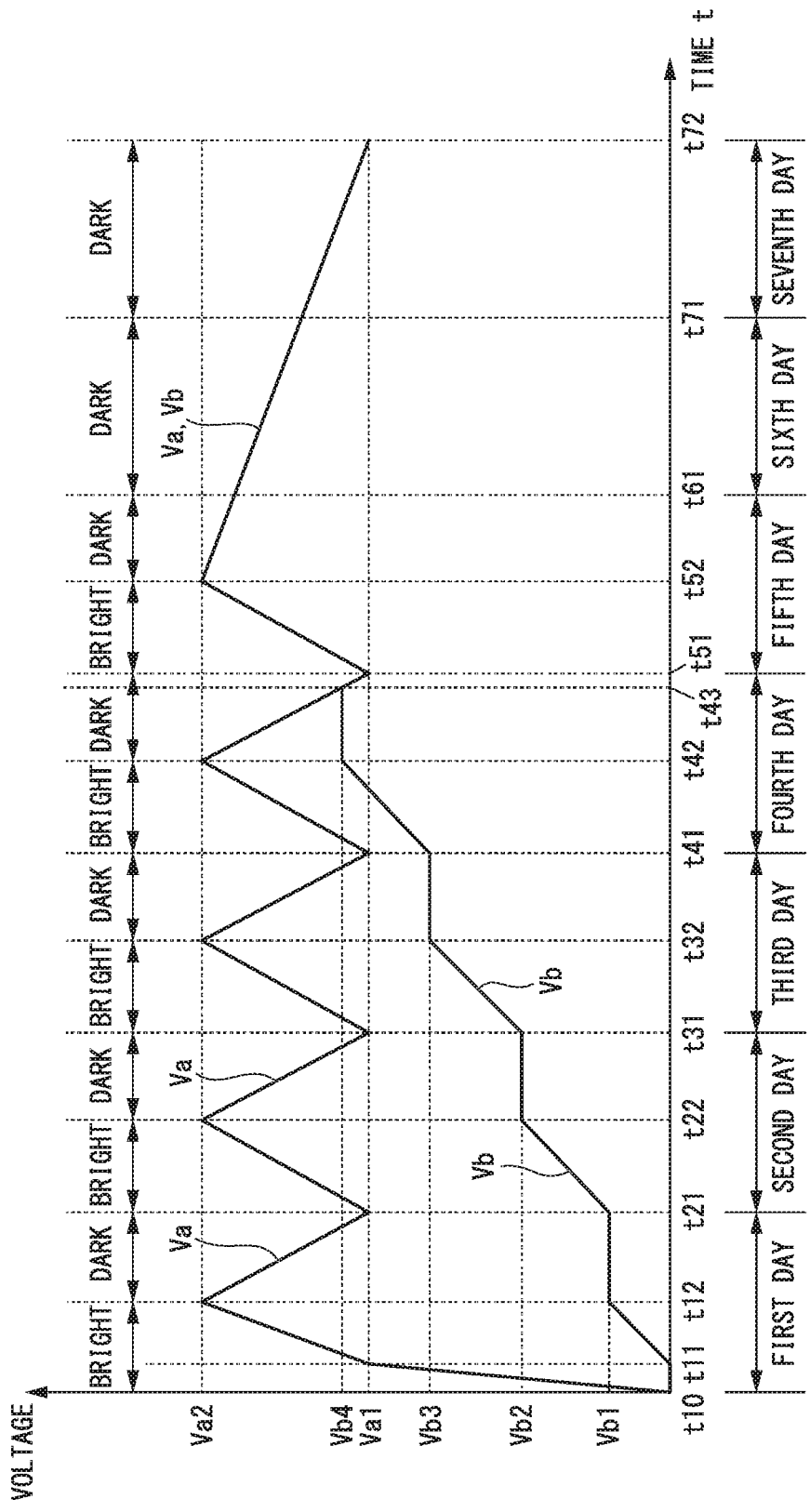
FIG. 8 is an image diagram showing an example in which the power storage system 101 is operated on a weekly basis.

FIG. 8 is an image diagram showing an example in which the power storage system 101 is operated on a weekly basis. In the example shown in FIG. 8, a transverse axis expresses elapse of time t, and a longitudinal axis expresses a voltage. The image shows an embodiment of voltage changes regarding the voltage Va of the storage battery A121 and the voltage Vb of the storage battery B122.

FIG. 8 does not show specific change characteristics of the voltages of the storage battery A121 and the storage battery B122 but conceptually shows an embodiment of charging of the storage battery A121 and the storage battery B122. In other words, FIG. 8 conceptually shows the tendency of voltage changes in the storage battery A121 and the storage battery B122 on a weekly basis (from Monday to Sunday) in a case where a "bright" period in which the inside of an office is bright due to a lamp or incidence of external light and a "dark" period in which the indoor lamp is put off and thus the inside thereof is dark are repeated daily.

Hereinafter, with reference to FIG. 8, a description will be made of a summary of changes in the voltage Va of the storage battery A121 and the voltage Vb of the storage battery B122 on a weekly basis.

First, it is assumed that both of the storage battery A121 and the storage battery B122 are not charged at an initial time (time point t10) on the first day. At the time point t10, the inside of the office is bright due to the lamp or external light, and the supply of power to the storage battery A121 from the solar battery 110 is started after the time point t10.

Successively, if the voltage Va of the storage battery A121 gradually increases, and the voltage Va of the storage battery A121 becomes a voltage Va1 at a time point t11, the supply of power to the storage battery B122 is started, and thus the voltage Vb of the storage battery B122 starts to increase.

Next, power is continuously supplied to the storage battery A121 and the storage battery B122 from the time point t11 to a time point t12, that is, until the lamp or the like of the office is put of and thus the "dark" period occurs at the time point t12, and thus the voltage Va of the storage battery A121 increases to a voltage Va2 and the voltage of the storage battery B122 increases to a voltage Vb1 at the time point t12.

At the time point t12, if the lamp or the like of the office is put off, thus the office becomes dark, and the "dark" period occurs, power is not supplied from the solar battery 110. During the "dark" period from the time point t12 to a time point t21 at which the lamp is lighted on the second day, power is supplied from the storage battery A121 to the external load apparatus 200, and thus the voltage Va of the storage battery A121 gradually decreases after the time point t12. The supply of power to the storage battery B122 is stopped, and thus the voltage of the storage battery B122 becomes a constant voltage as the voltage Vb1. The voltage of the storage battery A121 is reduced to the voltage Va1 at the time point t21.

The storage battery A121 is set to supply the voltage Va1 to the external load apparatus 200 so as to continuously drive the external load apparatus 200 even in a state in which the voltage Va of the storage battery A121 is reduced to the voltage Va1. In other words, a charging capacity of the storage battery A121 is set to drive the external load apparatus 200 in the "dark" period in which the lamp or the like of the office is put off, and the office becomes dark.

As mentioned above, in the power storage system 101, the supply of power to the storage battery A121 and the supply of power to the storage battery B122 are performed in the "bright" period, and power is supplied from the storage battery A121 to the external load apparatus 200 and power stops being supplied to the storage battery B122 in the "dark" period.

Next, in the same manner for the second day, in the "bright" period from the time point t21 to a time point t22 on the second day, power is supplied to the storage battery A121 and the storage battery B122, and the voltage of the storage battery B122 increases to a voltage Vb2. Similarly, in the "bright" period from a time point t31 to a time point t32 on the third day, power is supplied to the storage battery A121 and the storage battery B122, and the voltage of the storage battery B122 increases to a voltage Vb3. Similarly, in the "bright" period from a time point t41 to a time point t42 on the fourth day, power is supplied to the storage battery A121 and the storage battery B122, and the voltage of the storage battery B122 increases to a voltage Vb4.

Next, in the "dark" period from the time point t42 on the fourth day to a time point t51 on the fifth day, power is supplied from the storage battery A121 to the external load apparatus 200 so that the voltage Va of the storage battery A121 gradually decreases, and thus the voltage Va of the storage battery A121 becomes the same as the voltage Vb of the storage battery B122 at a time point t43.

After the time point t43 on the fourth day, the switch SW1 of the switch unit 140 is continuously in a turned-on state, and the voltage of the storage battery A121 and the voltage of the storage battery B122 change to the same voltage (Va≅Vb).

The "dark" period occurs from a time point t52 on the fifth day. A period from the time point t52 on the fifth day to a time point t61, a period from the time point t61 on the sixth day which is a holiday to a time point t71, and a period from the time point t71 on the seventh day which is also a holiday to a time point t72 are all the "dark" periods. In the "dark" period from the time point t52 to the time point t72, power is supplied to the external load apparatus 200 from both of the storage battery A121 and the storage battery B122.

In a case where power is supplied from the storage battery A121 to the storage battery B122, the voltage Va of the storage battery A121 is higher than the voltage of the storage battery B122 by a voltage (for example, about 0.3 V) reduced in a semiconductor element forming the switch SW1 of the switch unit 140. Conversely, in a case where power is supplied from the storage battery B122 to the power supply line DCL1, the voltage Va of the storage battery A121 is lower than the voltage Vb of the storage battery B122 by the voltage reduced in the semiconductor element forming the switch SW1.

Thus, in a case where the voltage Va of the storage battery A121 is higher than the voltage of the storage battery B122 even in a state in which the switch SW1 of the switch unit 140 is in a turned-on state, electric charge of the storage battery A121 is preferentially supplied to the external load apparatus 200. If the electric charge accumulated in the storage battery A121 is reduced, and thus the voltage Va of the storage battery A121 decreases, the storage battery A121 is supplied with electric charge from the storage battery B122. Consequently, power is supplied to the external load apparatus 200 from the storage battery A121. Alternatively, power is directly supplied to the external load apparatus 200 from the storage battery B122 via the switch unit 140 and the power supply line DCL1.

As described above, in a case where the power storage system 101 is operated on a weekly basis, the storage battery B122 can be charged on weekdays (the first day to the fifth day), and power stored in the storage battery B122 can be used on holidays (the sixth day and the seventh day).

Figure 9:
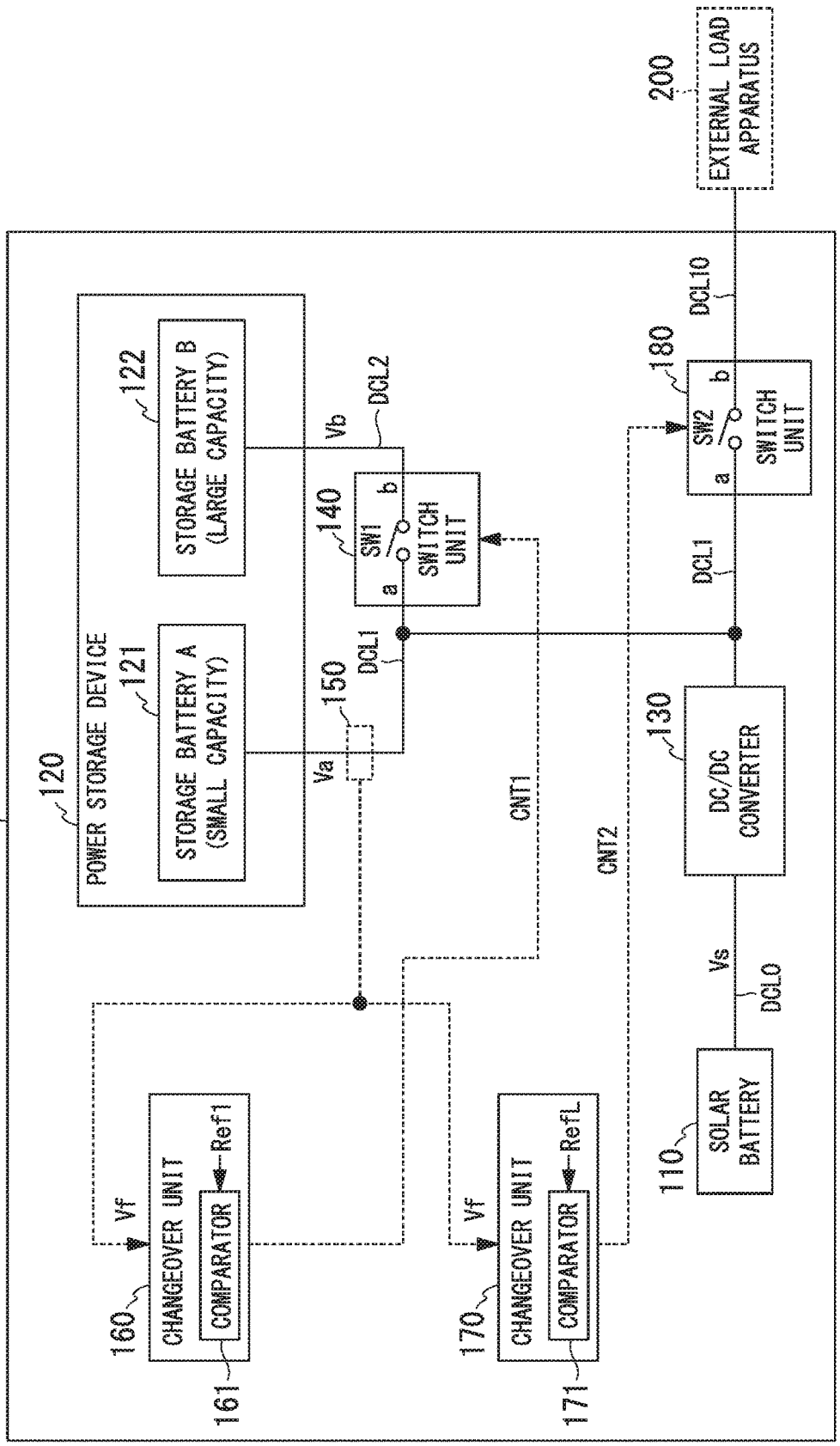
FIG. 9 is a configuration diagram showing a modification example of the power storage system 101.

FIG. 9 is a configuration diagram showing a modification example of the power storage system 101.

A power storage system 101A shown in FIG. 9 is different from the power storage system 101 shown in FIG. 3 in that a changeover unit 170 (third changeover unit), and a switch unit 180 (third switch unit) are provided.

In FIG. 9, the voltage detection unit 150 outputs the detection signal Vf for the voltage Va of the storage battery A121 to the changeover unit 160 and the changeover unit 170.

One terminal a of the switch unit 180 is connected to the power supply line DCL1, and the other terminal b thereof is connected to the external load apparatus 200 via a power supply line DCL10.

The switch unit 180 turns on or off an internal switch SW2 according to instruction content of a control signal CNT2 which is input from the changeover unit 170, and thus performs switching between an electrical connection state and disconnection state between the power supply line DCL1 and the power supply line DCL10. In other words, if the switch SW2 is turned on, the power supply line DCL1 and the power supply line DCL10 are electrically connected to each other, and thus power is supplied from the power storage system 101A to the external load apparatus 200.

The changeover unit 170 includes a comparator 171. The comparator 171 compares a predetermined reference voltage RefL generated by a reference voltage generation circuit (not shown) with the detection signal Vf for the voltage Va of the storage battery A121 which is input from the voltage detection unit 150. The reference voltage RefL corresponds to the driving possible voltage VL (third threshold voltage) of the external load apparatus 200, and is used to determine whether or not the voltage Va of the storage battery A121 exceeds the driving possible voltage VL of the external load apparatus 200.

The changeover unit 170 outputs the control signal CNT2 to the switch unit 180 in response to a comparison result in the comparator 171. The control signal CNT2 is used to control turning on and off of the switch SW2 of the switch unit 180. The switch unit 180 performs opening or closing of the switch SW2 on the basis of instruction content of the control signal CNT2.

In a case where the value of the storage battery A121 is equal to or less than the voltage VL, the changeover unit 170 turns off the switch SW2 of the switch unit 180. Consequently, the power supply line DCL1 is electrically disconnected from the power supply line DCL10, and thus power of the power storage system 101A is not supplied to the external load apparatus 200.

In other words, in a case where the voltage Va of the storage battery A121 exceeds the voltage VL, the changeover unit 170 turns on the switch SW2. Consequently, the power supply line DCL1 is connected to the power supply line DCL10, and thus power of the power storage system 101A is supplied to the external load apparatus 200.

Consequently, the power storage system 101A may supply power to the external load apparatus 200 only in a case where a voltage corresponding to an input power specification (input voltage range) of the external load apparatus 200 can be supplied.

In the power storage system 101 and the power storage system 101A, a description has been made of an example in which two storage batteries such as the storage battery A121 and the storage battery B122 are used. However, a third storage battery C (not shown) having a capacity larger than that of the storage battery B122 may be provided. In this case, power is also supplied to the storage battery C in a case where the voltage Va of the storage battery A121 and the voltage Vb of the storage battery B122 are equal to or higher than a predetermined voltage. Consequently, the storage battery C may be used as a storage battery for use in emergency or a storage battery corresponding to a long period of time such as a monthly basis.

As described above, the power storage system 101 is provided with a plurality of storage batteries including the storage battery A121 (first storage battery) and the storage battery B122 (second storage battery), the switch unit 140, and the changeover unit 160. The storage battery A121 is supplied with power generated by a solar battery. The storage battery B122 has a capacity larger than that of the storage battery A121. The switch unit 140 performs switching between an electrical connection state and disconnection state between the storage battery A121 and the storage battery B122. The changeover unit 160 compares the voltage Va of the storage battery A121 with the voltage V1 (second threshold voltage), and controls the switch unit 140 on the basis of a comparison result. In a case where the voltage Va of the storage battery A121 is equal to or lower than the voltage V1, the changeover unit 160 controls the switch unit 140 so that the storage battery A121 and the storage battery B122 are disconnected from each other, and thus power generated by the solar battery 110 is supplied to only the storage battery A121. In a case where the voltage of the storage battery A121 exceeds the voltage V1, the changeover unit 160 controls the switch unit 140 so that the storage battery A121 and the storage battery B122 are connected to each other, and thus power is supplied to the storage battery B122 from the storage battery A121.

As mentioned above, the power storage system 101 uses two types of storage battery A121 and the storage battery B122 having different capacities, and the switch unit 140. Power is preferentially supplied to the first storage battery A121 up to the voltage VL (more accurately, the voltage V1 causing power to be supplied to the storage battery B122) causing the external load apparatus 200 to be operated. In a case where the voltage Va of the storage battery A121 exceeds the voltage V1, power is supplied from the storage battery A121 to the storage battery B122.

Consequently, it is possible to rapidly increase the output voltage from the power storage system 101 even in a case where the storage battery having a large capacity is used. Thus, the power storage system 101 can rapidly activate the external load apparatus 200.

Figure 10:
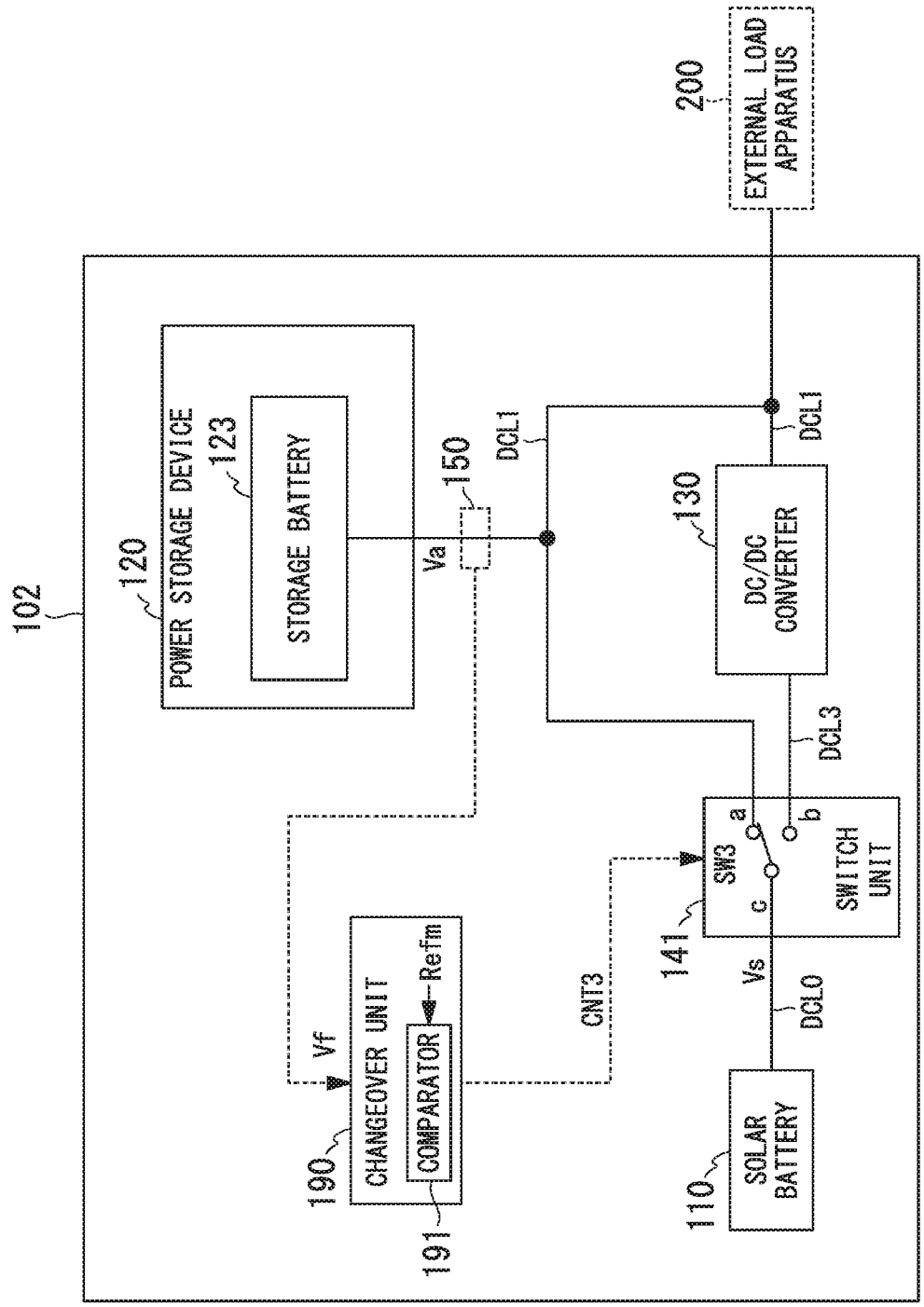
FIG. 10 is a configuration diagram showing a configuration example of a power storage system 102.

FIG. 10 is a configuration diagram showing a configuration example of a power storage system 102.

When compared with the power storage system 101 shown in FIG. 3, the power storage system 102 shown in FIG. 10 is different therefrom as follows. First, the power storage system 102 includes a switch unit 141 (first switch unit) instead of the switch unit 140 shown in FIG. 3. The power storage device 120 is constituted of a single storage battery 123. A comparator 191 of a changeover unit 190 (first changeover unit) compares the detection signal Vf for the voltage Va of the storage battery A121 with a predetermined reference voltage Refm output from a reference voltage generation circuit (not shown). The switch unit 141 has a contact point c which is connected to the solar battery 110 via the power supply line DCL0, a contact point a which is connected to the power supply line DCL1, and a contact point b which is connected to the DC/DC converter 130 via a power supply line DCL3. Remaining configurations are the same as those of the power storage system 101 shown in FIG. 3. Thus, the same constituent element is given the same reference numeral, and repeated description will be omitted.

Meanwhile, in a case where charging is performed in a low voltage state in which a voltage of the storage battery 123 is close to 0 V (zero volts), a general DC/DC converter steps up a voltage with considerably low efficiency, and a conversion loss during stepping-up increases. This state is called a start-up mode or a cold start mode, and causes a great problem in a case where low power is stored as in energy harvesting. In other words, the DC/DC converter 130 can perform a highly efficient boosting operation called main boost for the first time after power is stored in the storage battery 123 up to a predetermined voltage. The conversion efficiency of the DC/DC converter 130 is about 10% to 40% in the start-up mode or the cold start mode in which the conversion efficiency is low, and is about 70% to 90% in the main boost mode in which the conversion efficiency is high.

In the following description, a voltage Va of the storage battery 123 causing the conversion efficiency of the DC/DC converter 130 to be equal to or more than a predetermined value will be referred to as a main boost voltage Vm. As the main boost voltage Vm, that is, a voltage bringing the DC/DC converter 130 into the main boost mode, a voltage of the storage battery 123 causing the conversion efficiency of the DC/DC converter 130 to be 70% or more is preferably used.

Therefore, in the power storage system 102, the comparator 191 of the changeover unit 190 compares the detection signal Vf for the voltage Va of the storage battery 123 with the predetermined reference voltage Refm, so as to determine whether or not the voltage Va of the storage battery 123 exceeds a predetermined voltage Vc which is equal to or higher than the main boost voltage Vm. The reference voltage Refm corresponds to a voltage Vm of the storage battery 123, and is used to determine whether or not the voltage Va of the storage battery 123 exceeds a predetermined voltage Vc (first threshold voltage) which is equal to or higher than the boost voltage Vm. As examples of the voltage Vm causing main boost and the predetermined voltage Vc in the present embodiment, the voltage Vm causing main boost is 1.8 V, and the predetermined voltage Vc (first threshold voltage) is 2.0 V.

In a case where the voltage Va of the storage battery 123 is equal to or lower than the predetermined voltage Vc, the changeover unit 190 electrically connects the contact point a of the switch SW3 to the contact point c thereof so that power is directly supplied from the solar battery 110 to the storage battery 123. In a case where the voltage of the storage battery 123 exceeds the predetermined voltage Vc, the changeover unit 190 electrically connects the contact point b of the switch SW3 to the contact point c thereof so that power is supplied to the storage battery 123 via the DC/DC converter 130. The predetermined voltage Vc (first threshold value) may be set so that power is supplied to the DC/DC converter 130 after the DC/DC converter 130 is brought into the main boost mode, and the predetermined voltage (first threshold value) Vc may be the same as the voltage Vm bringing the DC/DC converter 130 into the main boost mode.

FIG. 11 is an explanatory diagram showing an operation of a charging operation of the storage battery 123.

As shown in a state (1) in FIG. 11, the changeover unit 190 electrically connects the contact point a of the switch SW3 of the switch unit 141 to the contact point c thereof until the voltage Va of the storage battery 123 becomes the predetermined voltage Vc. A charging current Ia is made to flow through the storage battery 123 from the solar battery 110 so that power is directly supplied thereto. Thereafter, if the voltage Va of the storage battery 123 becomes the predetermined voltage Vc, the changeover unit 190 electrically connects the contact point b of the switch SW3 of the switch unit 141 to the contact point c thereof so that power is supplied from the solar battery 110 to the DC/DC converter 130. A current Ib is made to flow through the storage battery 123 from the DC/DC converter 130 so that power is supplied thereto.

Figure 12:
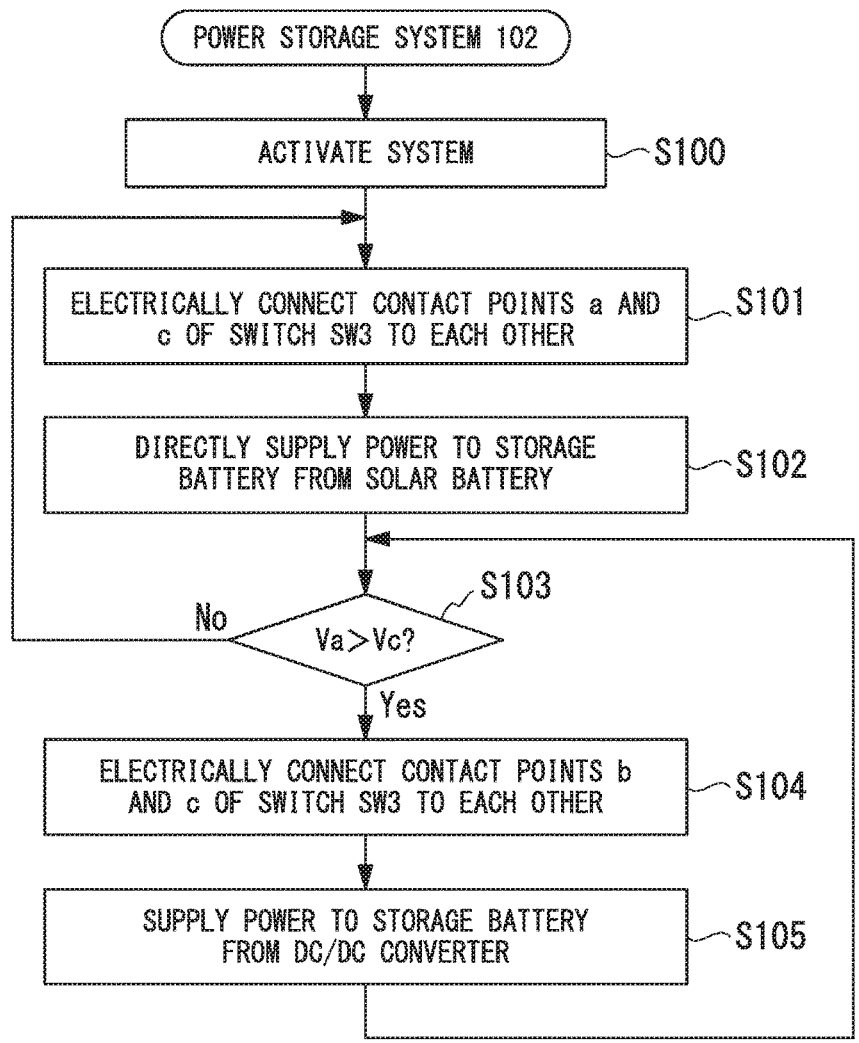
FIG. 12 is a flowchart showing a flow of processes in the power storage system 102.

FIG. 12 is a flowchart showing a flow of processes in the power storage system 102, and is a flowchart showing a flow of the above-described operations in the power storage system 102. Hereinafter, with reference to FIG. 12, the flow of the processes will be described.

First, it is assumed that the storage battery 123 is not charged. If the power storage system 102 is activated (step S100), the changeover unit 190 initially sends a control signal CNT3 to the switch unit 140 so that the contact point a of the switch SW3 of the switch unit 141 is electrically connected to the contact point c thereof, and the contact point b is electrically disconnected from the contact point c (step S101). Consequently, the changeover unit 190 causes power to be directly supplied from the solar battery 110 to the storage battery 123 (step S102).

Successively, power is supplied to the storage battery 123, and thus the voltage Va (which is the same as a voltage of the power supply line DCL1) of the storage battery 123 increases. Next, the comparator 191 of the changeover unit 190 determines whether or not the voltage Va of the storage battery 123 exceeds the predetermined voltage Vc (step S103).

In a case where it is determined that the voltage Va of the storage battery 123 does not exceed the predetermined voltage Vc in step S103 (step S103: No), the flow returns to the process in step S101. In this case, the changeover unit 190 electrically connects the contact point a of the switch SW3 of the switch unit 141 to the contact point c thereof, and electrically disconnects the contact point b from the contact point c, so that power continues to be directly supplied from the solar battery 110 to the storage battery 123.

Next, in a case where charging of the storage battery 123 is performed, the voltage Va of the storage battery 123 increases, and it is determined that the voltage Va of the storage battery 123 exceeds the voltage Vc (step S103: Yes), the flow proceeds to a process in step S104. In this case, the changeover unit 190 electrically disconnects the contact point a of the switch SW3 of the switch unit 141 from the contact point c thereof, and electrically connects the contact point b to the contact point c (step S104). Consequently, the changeover unit 190 causes power to be supplied to the storage battery 123 from the DC/DC converter 130 (step S105).

Next, the changeover unit 190 returns to the process in step S103, and starts the processes from step S103 again.

In the power storage system 102, power is directly supplied from the solar battery 110 to the storage battery 123 until the voltage Va of the storage battery 123 becomes the predetermined vcc on the basis of the flow of the processes. If the voltage Va of the storage battery 123 exceeds the predetermined voltage Vc, power can be supplied to the storage battery 123 from the solar battery 110 via the DC/DC converter 130. In other words, in the power storage system 101A, when power is supplied to the storage battery 123 which is in a state in which a charging voltage is low, power can be supplied without being influenced by a conversion loss during stepping-up of a voltage in the DC/DC converter. It is possible to shorten time for storing power in the storage battery 123 in a state in which the voltage Va to which the storage battery 123 is charged is low.

In the power storage system 102, it is determined whether or not power is to be supplied to the storage battery 123 via the DC/DC converter 130 on the basis of only the voltage Va of the storage battery 123.

Particularly, in an environment of predetermined illuminance or lower, a low illuminance dye-sensitized solar battery for low illuminance is used as the storage battery 123, and thus generated power is low. In this case, the DC/DC converter 130 which is electrically connected to the storage battery 123 is in a mode in which the conversion efficiency is low until the voltage Va of the storage battery 123 is equal to or higher than the first threshold voltage Vm. If the voltage of the storage battery 123 is equal to or higher than the first threshold voltage, the DC/DC converter 130 is brought into the main boost mode in which the conversion efficiency is high.

Therefore, the power storage system 102 is considerably effective in the environment of predetermined illuminance or lower.

As described above, the power storage system 102 is provided with the storage battery 123, the DC/DC converter 130, the switch unit 141, and the changeover unit 190. The storage battery 123 is supplied with power generated by the solar battery 110. The DC/DC converter 130 steps up an output voltage from the solar battery 110 to a predetermined voltage. The switch unit 141 performs switching between supply of an output voltage from the solar battery 110 directly to the storage battery 123 supply of an output voltage from the solar battery 110 to the storage battery 123 via the DC/DC converter 130. In a case where the voltage Vc which is equal to or higher than the voltage Vm of the storage battery 123 bringing the DC/DC converter 130 into the main boost mode is a first threshold voltage, the changeover unit 190 compares the voltage of the storage battery 123 with the first threshold voltage Vc, and controls the switch unit 141 according to a comparison result. In a case where the voltage of the storage battery 123 is equal to or lower than the first threshold voltage Vc, the changeover unit 190 controls the switch unit 141 so that power is directly supplied from the solar battery 110 to the storage battery 123. In a case where the voltage of the storage battery 123 exceeds the first threshold voltage Vc, the changeover unit 190 controls the switch unit 141 so that power is supplied from the solar battery 110 to the storage battery 123 via the DC/DC converter 130.

In the power storage system 102 with this configuration, the switch unit 141 which switches whether an output voltage from the solar battery 110 is directly supplied to the storage battery 123 or is supplied thereto via the DC/DC converter 130. The changeover unit 190 determines whether or not the voltage Va of the storage battery 123 exceeds the predetermined voltage Vc, and controls the switch unit 141 so that power is directly supplied to the storage battery 123 from the solar battery 110 in a case where the voltage Va of the storage battery 123 is equal to or lower than the predetermined voltage Vc. In a case where the voltage Va of the storage battery 123 exceeds the predetermined voltage Vc, the changeover unit 190 controls the switch unit 141 so that power is supplied to the storage battery 123 from the solar battery 110 via the DC/DC converter 130.

Consequently, in the power storage system 102, power can be directly supplied to the storage battery 123 from the solar battery 110 without being influenced by a conversion loss during boosting in the DC/DC converter 130 in a state in which the voltage Va of the storage battery 123 is low. As mentioned above, in the power storage system 102, it is possible to shorten time for storing power in the storage battery 123 in a state in which the voltage Va of the storage battery 123 is low. Therefore, it is possible to rapidly increase the voltage of the storage battery 123.

Figure 13:
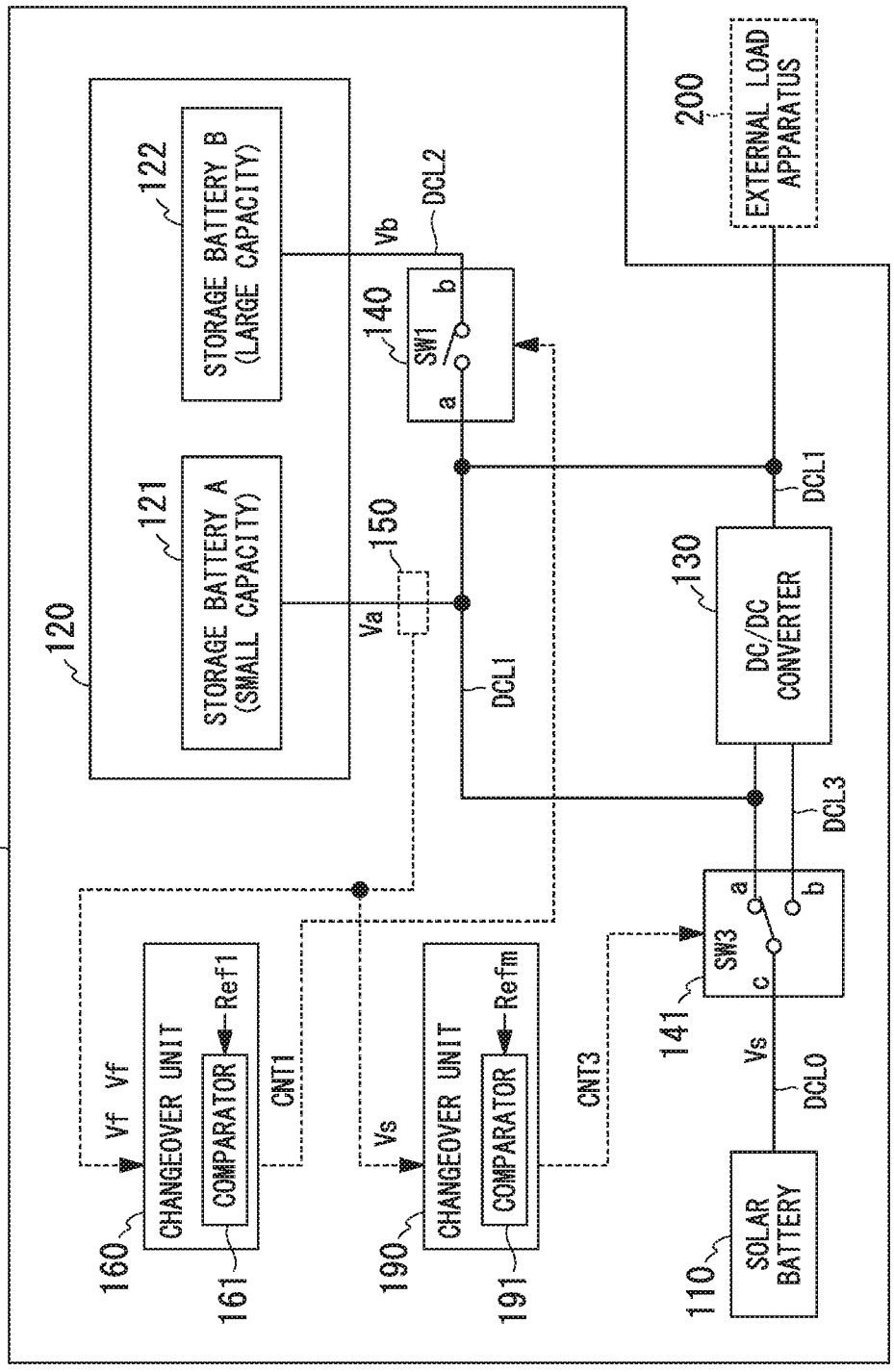
FIG. 13 is a configuration diagram showing a configuration example of a power storage system 103.

FIG. 13 is a configuration diagram showing a configuration example of a power storage system 103.

When compared with the power storage system 101 shown in FIG. 3, the power storage system 103 shown in FIG. 13 is only different therefrom in that a switch unit 141 (first switch unit) and a changeover unit 190 (first changeover unit) are additionally provided. Remaining configurations are the same as those of the power storage system 101 shown in FIG. 3. Thus, the same constituent element is given the same reference numeral, and a repeated description will be omitted here.

In the power storage system 103 shown in FIG. 13, in a case where the storage battery A121 (first storage battery) is not charged, or the voltage Va of the storage battery A121 is low, the changeover unit 160 turns off the switch SW1 of the switch unit 140 so that power is supplied to only the storage battery A121 in the same manner as in the power storage system 101.

Simultaneously, in the same manner as in the power storage system 102, the changeover unit 190 electrically connects the contact point a of the switch SW3 of the switch unit 141 to the contact point c thereof, and electrically disconnects the contact point b from the contact point c. In other words, in the power storage system 103, in a case where the storage battery A121 is not charged, or the voltage Va of the storage battery A121 is low, power is directly supplied to the storage battery A121 from the solar battery 110 without using the DC/DC converter 130.

After power starts to be supplied to the storage battery A121, in a case where the voltage Va of the storage battery A121 gradually increases, and the voltage Va reaches the predetermined voltage Vc, the changeover unit 190 electrically connects the contact point b of the switch SW3 of the switch unit 141 to the contact point c thereof (and electrically disconnects the contact point a from the contact point c), so that power is supplied to the storage battery A121 via the DC/DC converter 130.

Thereafter, in the same manner as in the power storage system 101, in a case where the voltage of the storage battery A121 reaches the driving possible voltage VL (VL>Vc) causing the external load apparatus 200 to be driven, power starts to be supplied to the external load apparatus 200, and in a case where the voltage of the storage battery A121 reaches the voltage V1 (second threshold voltage) (V1>VL>Vc), power starts to be supplied to the storage battery B122 from the storage battery A121.

As mentioned above, in the power storage system 103, during starting of charging, first, power is preferentially supplied to only the storage battery A121. When the voltage Va of the storage battery A121 is lower than the predetermined voltage Vc, power is directly supplied to the storage battery A121 from the solar battery 110 which is a power generation element without using the DC/DC converter 130. Consequently, in the power storage system 103, power can be selectively supplied to the storage battery A121 having a small capacity, and power can be supplied to the storage battery A121 without being influenced by a conversion loss during boosting in the DC/DC converter. Thus, it is possible to rapidly increase the voltage Va of the storage battery A121.

Figure 14:
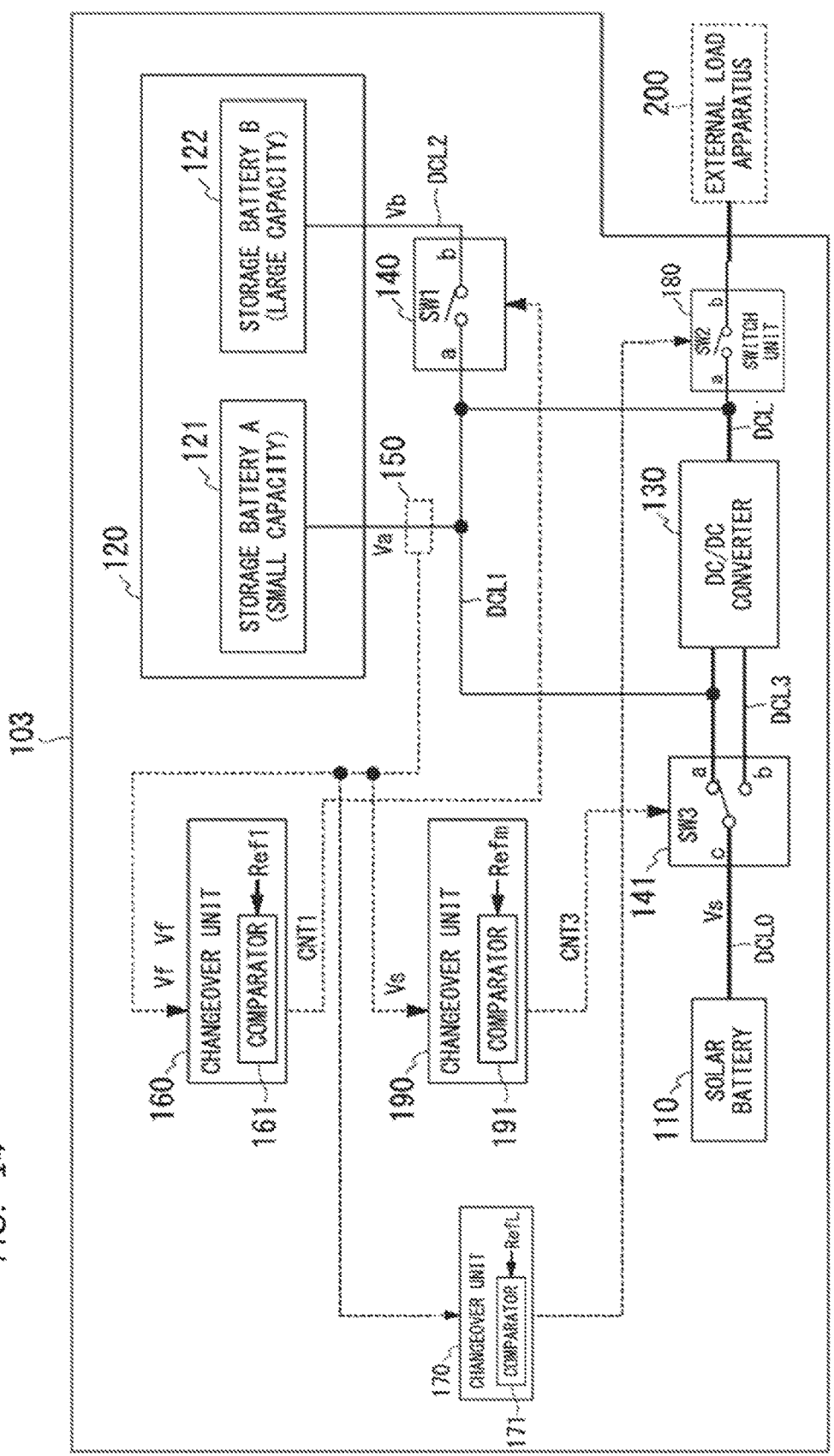
FIG. 14 is a configuration diagram showing a configuration example of a power storage system 103.

As shown in FIG. 14 the power storage system 103 may be additionally provided with the changeover unit 170 and the switch unit 180 as shown in FIG. 9 (power storage system 101A).

A description has been made of an example in which the solar battery 110 is used as a power generation element in the above-described power storage system (100, 101, 101A, 102, 103), but, power generation means, vibration, heat, wind power, electric waves, and the like may be used.

As mentioned above, the present invention has been described, but the power storage system of the present invention is not limited to the above-described shown examples, and may be variously modified within the scope without departing from the spirit of the present invention.

DESCRIPTION OF THE REFERENCE SYMBOLS 100, 101, 101A, 102, AND 103 POWER STORAGE SYSTEM
110 SOLAR BATTERY (POWER GENERATION ELEMENT)
111, 112, 113, AND 114 SOLAR BATTERY CELL (POWER GENERATION ELEMENT)
120 POWER STORAGE DEVICE
121 STORAGE BATTERY A (FIRST STORAGE BATTERY)
122 STORAGE BATTERY B (SECOND STORAGE BATTERY)
130 DC/DC CONVERTER
140 SWITCH UNIT (SECOND SWITCH UNIT)
141 SWITCH UNIT (FIRST SWITCH UNIT)
180 SWITCH UNIT (THIRD SWITCH UNIT)
150 VOLTAGE DETECTION UNIT
160 CHANGEOVER UNIT (SECOND CHANGEOVER UNIT)
170 CHANGEOVER UNIT (THIRD CHANGEOVER UNIT)
190 CHANGEOVER UNIT (FIRST CHANGEOVER UNIT)
161, 171, AND 191 COMPARATOR
200 EXTERNAL LOAD APPARATUS
210 ENVIRONMENT MONITORING APPARATUS

The invention claimed is:

1. A power storage system comprising:
a power generation element that performs environmental power generation;
a storage battery that is supplied with power generated by the power generation element;
a DC/DC converter that converts an output voltage from the power generation element into a predetermined voltage;
a first switch unit that switches whether to directly supply the output voltage from the power generation element to the storage battery or to supply thereto via the DC/DC converter;
a first changeover unit that compares a voltage of the storage battery with a first threshold voltage, and in a case where the first threshold voltage is a voltage which is equal to or higher than a-voltage of the storage battery, the first changeover unit controls the first switch unit according to a comparison result, and brings the DC/DC converter into a main boost mode;
a second switch unit that performs switching between an electrical connection state and disconnection state between the first storage battery and the second storage battery; and
a second changeover unit that compares the voltage of the first storage battery with a second threshold voltage, and controls the second switch unit according to a comparison result, wherein
in a case where the voltage of the storage battery is equal to or lower than the first threshold voltage, the first changeover unit controls the first switch unit so that the output voltage is directly supplied from the power generation element to the storage battery,
in a case where the voltage of the storage battery exceeds the first threshold voltage, the first changeover unit controls the first switch unit so that the output voltage is supplied from the power generation element to the storage battery via the DC/DC converter,
the storage battery is constituted of a first storage battery and a second storage battery having a capacity larger than a capacity of the first storage battery,
in a case where the second threshold voltage is higher than the first threshold voltage, the output voltage is supplied to only the first storage battery from the power generation element if the voltage of the storage battery is equal to or lower than the second threshold voltage,
each of the first storage battery and the second storage battery is configured to supply power to an external load apparatus,
the second threshold voltage is equal to or higher than a voltage causing the external load apparatus to be operated,
in a case where the voltage of the first storage battery is equal to or lower than the second threshold voltage, the second changeover unit controls the second switch unit so that the first power generation element is supplied to only the first storage battery, and
in a case where the voltage of the first storage battery exceeds the second threshold voltage, the second changeover unit controls the second switch unit so that the first storage battery is connected to the second storage battery, and thus power is supplied from the first storage battery to the second storage battery where power is supplied to the second storage battery by both of power output from the DC/DC converter and electric charge accumulated in first storage battery.

2. The power storage system according to claim 1, further comprising:
a third switch unit that performs switching between an electrical connection state and disconnection state between the first storage battery and the second storage battery, and the external load apparatus; and
a third changeover unit that compares the voltage of the first storage battery with a third threshold voltage, and controls the third switch unit according to a comparison result, wherein
in a case where the voltage of the first storage battery is higher than the third threshold voltage, the third changeover unit controls the third switch unit so that the first storage battery and the second storage battery are connected to the external load apparatus, and
in a case where the voltage of the first storage battery is lower than the third threshold voltage, the third changeover unit controls the third switch unit so that the first storage battery and the second storage battery are disconnected from the external load apparatus.

3. The power storage system according to claim 2, wherein
the third threshold voltage is set to be a predetermined voltage higher than an operation voltage causing the external load apparatus to be operated, and to be lower than the second threshold voltage.

4. The power storage system according to claim 1, wherein the second changeover unit has hysteresis characteristics, and compares the voltage of the first storage battery with the second threshold voltage using the hysteresis characteristics, in a case where the voltage of the first storage battery exceeds the second threshold voltage, the second changeover unit controls the second switch unit so that the first storage battery is connected to the second storage battery, and in a case where the first storage battery is connected to the second storage battery, and the voltage of the first storage battery is reduced to a fourth threshold voltage or lower, the fourth threshold voltage being a predetermined voltage lower than the second threshold voltage and being a predetermined voltage higher than the first threshold voltage, the second changeover unit controls the second switch unit so that the first storage battery is disconnected from the second storage battery.

5. The power storage system according to claim 1, wherein the power generation element is constituted of power generation element cells which are connected in series to each other.

6. The power storage system according to claim 1, wherein the power generation element is a low illuminance solar battery which can be used in an environment of a predetermined illuminance or lower.

7. A power storage method comprising:

providing a power storage system including:

a storage battery that is supplied with power generated by a power generation element performing environmental power generation, wherein the storage battery is constituted of a first storage battery and a second storage battery having a capacity larger than a capacity of the first storage battery, each of the first storage battery and the second storage battery is configured to supply power to an external load apparatus, and a second threshold voltage is equal to or higher than a voltage causing the external load apparatus to be operated, a DC/DC converter that converts an output voltage from the power generation element into a predetermined voltage, a first switch unit that switches whether to directly supply the output voltage from the power generation element to the storage battery or to supply thereto via the DC/DC converter, and a first changeover unit that compares a voltage of the storage battery with a first threshold voltage, a second switch unit that performs switching between an electrical connection state and disconnection state between the first storage battery and the second storage battery; and a second changeover unit that compares the voltage of the first storage battery with the second threshold voltage, in a case where the first threshold voltage is a voltage which is equal to or higher than a voltage of the storage battery, causing the first changeover unit to control the first switch unit according to a comparison result, and bringing the DC/DC converter into a main boost mode;

in a case where the voltage of the storage battery is equal to or lower than the first threshold voltage, causing the first changeover unit to control the first switch unit so that the output voltage is directly supplied from the power generation element to the storage battery;

in a case where the voltage of the storage battery exceeds the first threshold voltage, causing the first changeover unit to control the first switch unit so that the output voltage is supplied from the power generation element to the storage battery via the DC/DC converter;

in a case where the second threshold voltage is higher than the first threshold voltage, supplying the output voltage to only the first storage battery from the power generation element if the voltage of the storage battery is equal to or lower than the second threshold voltage, in a case where the voltage of the first storage battery is equal to or lower than the second threshold voltage, causing the second changeover unit to control the second switch unit according to a comparison result to disconnect the first storage battery from the second storage battery, and supply power generated by the power generation element to only the first storage battery, and in a case where the voltage of the first storage battery exceeds the second threshold voltage, causing the second changeover unit to control the second switch unit according to a comparison result to connect the first storage batter to the second storage battery and supply power from the first storage battery to the second storage battery where power is supplied to the second storage battery by both of power output from the DC/DC converter and electric charge accumulated in the first storage battery.

* * * * *